United States Patent
Holbrook et al.

(10) Patent No.: US 10,262,700 B2
(45) Date of Patent: *Apr. 16, 2019

(54) SYSTEM AND METHOD FOR DETERMINING A CAUSE OF NETWORK CONGESTION

(71) Applicant: Arista Networks, Inc., Santa Clara, CA (US)

(72) Inventors: Hugh W. Holbrook, Palo Alto, CA (US); Kenneth James Duda, Menlo Park, CA (US); Douglas Gourlay, Menlo Park, CA (US); Anshul Sadana, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/693,337

(22) Filed: Aug. 31, 2017

(65) Prior Publication Data

US 2018/0012633 A1    Jan. 11, 2018

Related U.S. Application Data

(63) Continuation of application No. 13/953,684, filed on Jul. 29, 2013, now Pat. No. 9,794,141.

(Continued)

(51) Int. Cl.
*G11C 5/06* (2006.01)
*H04L 12/835* (2013.01)
(Continued)

(52) U.S. Cl.
CPC ............... *G11C 5/063* (2013.01); *G11C 5/02* (2013.01); *G11C 11/4076* (2013.01);
(Continued)

(58) Field of Classification Search
CPC ......... H04L 47/30; H04L 47/10; H04L 45/00; H04L 47/29; H04L 47/12; H04L 47/50;
(Continued)

(56) References Cited

U.S. PATENT DOCUMENTS

| 6,700,869 B1 | 3/2004 | Falco et al. |
| 2005/0052992 A1 | 3/2005 | Cloonan et al. |

(Continued)

FOREIGN PATENT DOCUMENTS

| WO | 2012/130264 A1 | 10/2012 |
| WO | WO 2012/130264 A1 | 10/2012 |

OTHER PUBLICATIONS

European Search Report EP Patent Appln No. EP 14 16 0105 dated Mar. 6, 2017 (2 pages).

*Primary Examiner* — Rownak Islam
(74) *Attorney, Agent, or Firm* — Womble Bond Dickinson (US) LLP

(57) ABSTRACT

A method and apparatus of a device that determines a cause and effect of congestion in this device is described. In an exemplary embodiment, the device measures a queue group occupancy of a queue group for a port in the device, where the queue group stores a plurality of packets to be communicated through that port. In addition, the device determines if the measurement indicates a potential congestion of the queue group, where the congestion prevents a packet from being communicated within a time period. If potential congestion exists on that queue group, the device further gathers information regarding packets to be transmitted through that port. For example, the device can gather statistics packets that are stored in the queue group and/or new enqueue packets.

18 Claims, 15 Drawing Sheets

Related U.S. Application Data

(60) Provisional application No. 61/784,574, filed on Mar. 14, 2013.

(51) Int. Cl.

| | | |
|---|---|---|
| *H04L 12/823* | (2013.01) | |
| *H04L 12/26* | (2006.01) | |
| *G11C 5/02* | (2006.01) | |
| *G11C 11/4076* | (2006.01) | |
| *G11C 11/4093* | (2006.01) | |
| *H01L 25/065* | (2006.01) | |
| *H01L 25/18* | (2006.01) | |
| *H04L 12/801* | (2013.01) | |
| *H01L 27/108* | (2006.01) | |

(52) U.S. Cl.
CPC ...... *G11C 11/4093* (2013.01); *H01L 25/0657* (2013.01); *H01L 25/18* (2013.01); *H04L 43/04* (2013.01); *H04L 43/062* (2013.01); *H04L 47/30* (2013.01); *H04L 47/32* (2013.01); *H01L 27/108* (2013.01); *H01L 2225/06541* (2013.01); *H01L 2924/0002* (2013.01); *H01L 2924/14* (2013.01); *H01L 2924/19043* (2013.01); *H01L 2924/3011* (2013.01); *H04L 47/10* (2013.01)

(58) Field of Classification Search
CPC ......... H04L 49/90; H04L 47/32; H04L 43/04; H04L 43/062; H04L 43/08; H04L 43/0882; G11C 5/02; G11C 5/063; G11C 11/4076; G11C 11/4093; H01L 2924/0002; H01L 2924/14; H01L 2924/19043; H01L 2924/3011; H01L 2225/06541; H01L 25/0657; H01L 25/18; H01L 27/108
USPC ........................................ 370/252, 235, 412
See application file for complete search history.

(56) References Cited

U.S. PATENT DOCUMENTS

| | | |
|---|---|---|
| 2006/0180845 A1 | 5/2006 | Kwan et al. |
| 2007/0076598 A1 | 4/2007 | Atkinson et al. |
| 2008/0253284 A1 | 10/2008 | Montalvo |
| 2009/0003209 A1 | 1/2009 | Kalkunte et al. |
| 2010/0097934 A1* | 4/2010 | Hendel .................. H04L 45/04 370/237 |
| 2010/0318641 A1 | 12/2010 | Bullard et al. |
| 2011/0085566 A1 | 4/2011 | Bucknell |
| 2012/0044814 A1 | 2/2012 | Natarajan |
| 2012/0213078 A1* | 8/2012 | Kitada .................... H04L 47/17 370/236 |
| 2014/0022901 A1 | 1/2014 | Suzuki et al. |
| 2014/0064079 A1 | 3/2014 | Kwan et al. |
| 2014/0064081 A1 | 3/2014 | Morandin |
| 2014/0078903 A1 | 3/2014 | Edsall |
| 2014/0192646 A1 | 7/2014 | Mir et al. |
| 2014/0211624 A1* | 7/2014 | Rajasekaran ........... H04L 47/30 370/235 |
| 2014/0219090 A1 | 8/2014 | Ramanathan et al. |

* cited by examiner

US 10,262,700 B2

SYSTEM AND METHOD FOR DETERMINING A CAUSE OF NETWORK CONGESTION

RELATED APPLICATIONS

This application claims the benefit of prior, co-pending non-provisional application Ser. No. 13/953,684, filed Jul. 29, 2013; which claims the benefit of priority of prior, U.S. Provisional Patent Application No. 61/784,574, filed Mar. 14, 2013, the entirety of which is incorporated by reference.

FIELD OF INVENTION

This invention relates generally to data networking and more particularly to determining a cause and/or effect of congestion of port of a network element.

BACKGROUND OF THE INVENTION

A network element (such as a router or switch) transmits and receives network data using one or more ports of that network element. Each of these ports has a physical link speed that limits the rate at which the network data can be transmitted from that port. The network element uses one or more queues to store the network data that is to be transmitted from one of the ports of the network element. The maximum data that a queue stores is based on the available buffer memory and a buffer configuration for that queue.

A problem called congestion can occur for network data transmission by the network element when the amount of network data that is to be transmitted by one of the ports is greater than the port and the associated queue can handle. In particular, congestion for a port occurs when network data cannot be transmitted through a port because the queue for that port is full and impairs the enqueueing of subsequent data. When congestion happens on a port, a system administrator would like to know the following information: (i) when did the congestion occur; (ii) what caused the congestion; and (iii) what is affected by the congestion.

Currently, a network element determines that congestion has occurred by counting the number of packets that have been dropped or marked as a result of congestion. For example, the network element polls dropped packet counters for each queue to determine the number of packets dropped on that port. The number of dropped packets for a port over a period of time can be an indication that congestion occurred. However, the polling period can be too large to adequately determine the answers to the three questions above. For example, a network element can have a polling period of the dropped packet counters can be on the order of tens of seconds (e.g., 45 seconds). With this large polling time, detecting when congestion occurs can be tens of seconds in the past, and make it difficult to determine what caused the congestion and also what is affected by the congestion. In addition, microbursts of congestion may not be detected if the burst does not cause congestion that results in dropped or marked packets. In addition, an administrator does not have access to information that indicates which network element marked a packet as a result of congestion, when the packet was marked or dropped due to congestion, or why a packet was marked or dropped due to congestion.

SUMMARY OF THE DESCRIPTION

A method and apparatus of a device that determines a cause and effect of congestion in this device is described. In an exemplary embodiment, the device measures a queue group occupancy of a queue group for a port in the device, where the queue group stores a plurality of packets to be communicated through that port. In addition, the device determines if the measurement indicates a potential congestion of the port. If a potential for congestion exists on that port, the device further gathers information regarding packets to be transmitted through that port. For example, the device can gather statistics packets that are stored in the queue group and/or statistics of new enqueue packets.

In a further embodiment, the device determines an effect of congestion in the device. The device measures a queue group occupancy of a queue group for a port in the device, where the queue group stores a plurality of packets to be communicated through that port. The device further determines if congestion exists on that port using the measurement, where the congestion prevents a packet of the plurality of packets from being communicated using the port within a time period. If the congestion exists on that port, the device additionally gathers information regarding packets to be transmitted through that port. For example, the device can gather statistics packets that are stored in the queue group and/or statistics of new enqueue packets.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
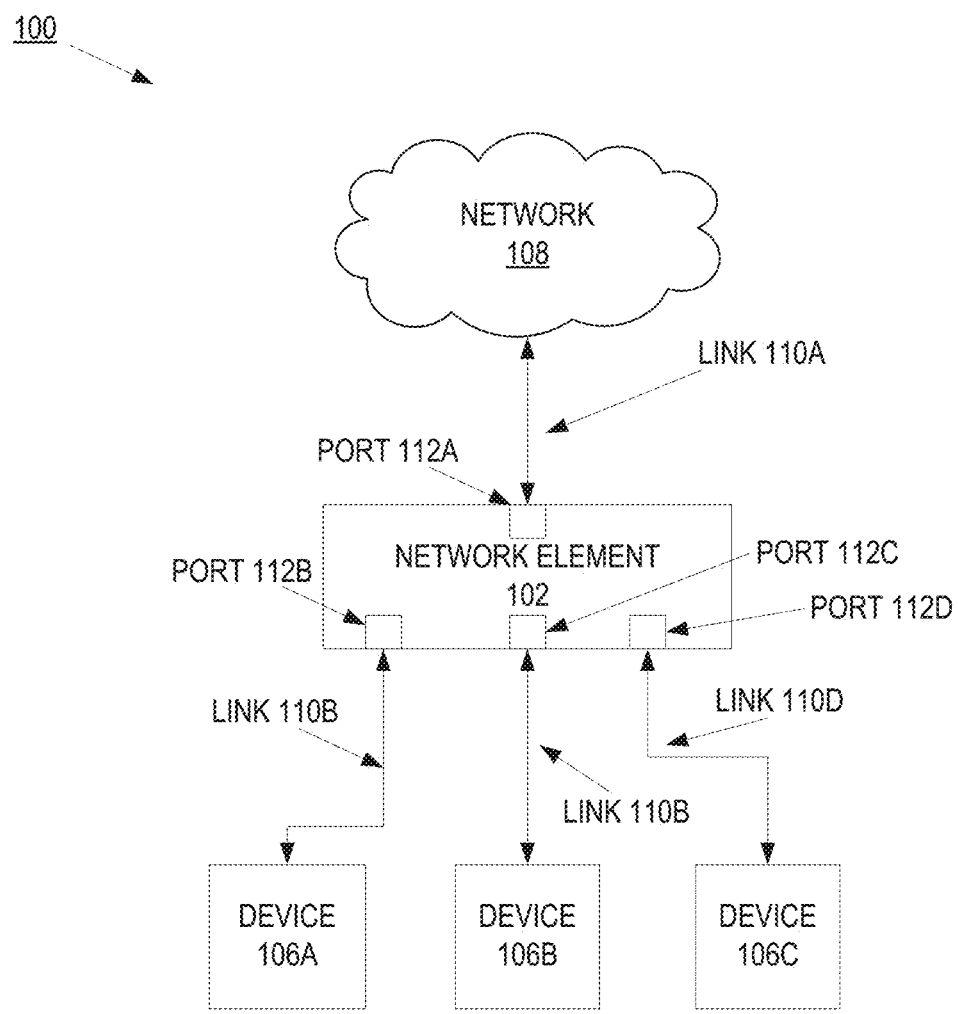
FIG. 1 is a block diagram of one embodiment of a system that includes a network element communicating network data between a network and a number of devices.

A method and apparatus of a device that determines a cause and effect of congestion in this device is described. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A method and apparatus of a device that determines a cause and effect of congestion in this device is described. In one embodiment, the device is a network element that can communicate network data (e.g., data packets or packets) with the one or more ports of the network element. Each of the ports of the network element has a corresponding queue group that is used to store the packets that are to be transmitted via that port. The network element periodically measures the queue group occupancy of the queue group by reading a stored value of the queue group occupancy. For example, the network element stores the queue group occupancy of a queue group in an ASIC that is on the data plane of the network element. A network congestion module of the network element retrieves the queue group occupancy value from the ASIC.

The network congestion module can perform one or more actions based of the queue group occupancy value. In one embodiment, the network congestion module uses different threshold to determine which action(s) to perform. The threshold can be a queue group occupancy tracking threshold, a sample occupants threshold, a sample new enqueues threshold, and a drop capture threshold. In one embodiment, the queue group occupancy tracking threshold is a threshold at which the network congestion module starts recording the queue group occupancy over time. The network congestion module uses the queue group occupancy recording to determine when to monitor the queue group occupancy prior to a potential congestion. In one embodiment, the sample occupants threshold is a threshold of queue group occupancy that indicates that there is potential congestion in the queue group. In one embodiment, the network congestion module can perform one or more of many different actions to characterize the packets that are queued in the queue group. In one embodiment, the sample new enqueue threshold is another threshold based on the queue group occupancy that indicates that there is potential congestion in the queue group. In one embodiment, the network congestion module can perform one or more of many different actions to characterize the packets that are to be enqueued in the queue group. In one embodiment, the drop capture threshold is a threshold that indicates that the queue group is fully occupied and that this queue group cannot store any further packets at this time. In one embodiment, network congestion module can perform one or more of many different actions to characterize the queued packets affecting the congestion, characterize packets to be enqueued that are affected by the congestion, and/or alleviate the actual congestion.

FIG. 1 is a block diagram of one embodiment of a system 100 that includes a network element 102 communicating network data between a network 108 and a number of devices 106A-C. In FIG. 1, the network element 102 is coupled to devices 106A-C and to network 108 via the respective links 110A-D. While in one embodiment, the respective links 110A-D between the network element 102 and either the device 106A-C and/or network 108 is a wired connection (e.g., copper, fiber, etc.), in alternate embodiments, a different type of link 110A-D is used (e.g., wireless, a combination of wireless and wired, etc.). In one embodiment, each of these links 110A-D has a physical link speed that represents the maximum throughput of data that a link 110A-D can transmit in a time period. In addition, the different types of protocols can be used to communicate network data over the connection (e.g., Ethernet, wireless, Synchronous Optical Networking (SONET), Fiber channel, Infiniband, etc.). In one embodiment, the network data being communicated by the network element 102 is a stream of data packets. In one embodiment, network element 102 communicates network data between devices 104A-C and network 108 or between devices 106A-C using a variety of communicating techniques (e.g., layer 2 switching, layer 3 routing, traffic shaping, applying a quality of service (QoS) policy, etc.).

In one embodiment, the network element 102 is a device that provides network access to a network 108 (e.g., physical network, virtualized network, etc.). A network element can be a switch, router, hub, bridge, gateway, etc., or any type of device that can provide access to a network. In one embodiment, the device 106A-C is any type of device that can communicate network data with another device (e.g., a personal computer, laptop, server, mobile device (e.g., phone, smartphone, personal gaming device, etc.), another network element, etc.). In one embodiment, the devices 106A-C can be a virtual machine or can be a device that hosts one or more virtual machines.

As described above, each of the links 110A-D has an associated physical link speed, where each physical link speed represents a maximum throughput for that link. In one embodiment, if the amount of network data is to be transmitted out one of the links 110A-D exceeds the physical link speed of that link, the network data that exceeds the physical link speed of that link is dropped and not transmitted out the link. This can occur if network data from multiple downstream links are destined for one link and/or if one of the links has a lower capacity than the other links. For example and in one embodiment, link 110A is an upstream link that is coupled to the network 108 and provides access to devices 106A-C that are coupled to the network element 102 via links 110B-D. In this example, devices 106A-C are transmitting network data through link 110A to network 108 at a rate that is greater than the physical link speed of link 110A and network data (e.g., packets) is dropped because this network data cannot be communicated through link 110A. Congestion for this link 110A occurs when network data cannot be transmitted through a port coupled to the link 110A because the queue group storing these packets is full and subsequent packets are dropped instead of being transmitted through that port. In one embodiment, when congestion happens on a port, a system administrator will want to know the following information: (i) when did the congestion occur, (ii) what caused the congestion; and (iii) what is affected by the congestion. As will be described in detail below, a queue group for a port is storage that is used to store packets of the network data for processing and/or forwarding. In one embodiment, a queue group for a port can be a single queue, a class of queues, multiple queues, or a multiple classes of queues.

In one embodiment, the congestion can be determined by counting the number of packets that are dropped. In this embodiment, the network element polls dropped packet counters for each port to determine the number of packets dropped on that port. In this embodiment, the number of dropped packets for a port over a period of time can be an indication that congestion has occurred. However, in this embodiment, the polling period can be too large to adequately determine the answers to the three questions above. For example and in one embodiment, a polling period of the dropped packet counters can be on the order of tens of seconds (e.g., 45 seconds). With this large polling time, detecting when congestion occurs can be tens of seconds behind the actual congestion occurrence, which can make it difficult to determine what caused the congestion and also what is affected by the congestion. In addition, microbursts of congestion may not be detected if the microburst does not result in dropped or marked packets. In one embodiment, a microburst is a period of congestion that is a short burst of network data that creates a short period of congestion on a port. In one embodiment, the lifetime of the microburst is smaller than the polling period of the dropped packet counters, which can make the microburst undetectable using a polling method to detect congestion. In addition and in this embodiment, the cause and effect of this congestion may not be detectable as well. One way to alleviate this problem is to make the polling periods smaller, where as the polling period get smaller, the cost to process the dropped packet data increases. Thus, it may not be feasible to decrease the polling period to catch occurrences of microburst congestion. Furthermore, other measures of congestion can be used to characterize the congestion (e.g., queue depth (e.g., number of bytes or packets in the queue), packet latency, number of buffers used, and/or number of buffer descriptors used).

Figure 2:
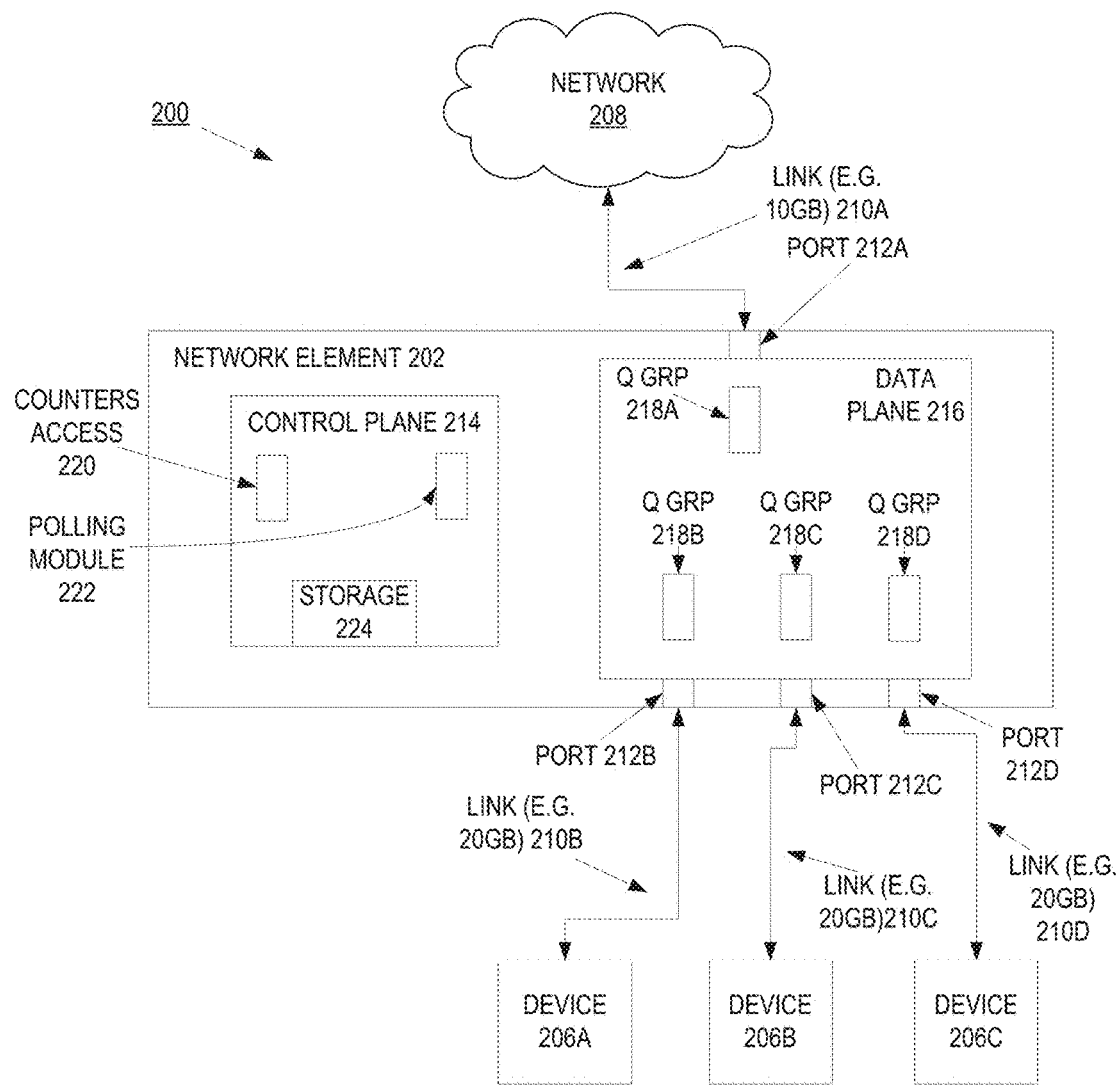
FIG. 2 is a block diagram of one embodiment of a system that includes a network element that communicates network data between a network and a number of devices, where the network element includes a control plane and a data plane, and the data plane includes a number of queue groups.

FIG. 2 is a block diagram of one embodiment of a system 200 that includes a network element 202 that communicates network data between a network 208 and a number of devices 210A, where the network element includes a control plane 214 and a data plane 216, and the data plane 216 includes a number of queue groups 218A-D. In FIG. 2, network element 202 is coupled to the network 208 and devices 206A-D via links 210A-D and ports 212A-D, respectively. While in one embodiment, the network element 202 is illustrated with four ports 212A-D and links 210A-D, in alternate embodiment, the network element 202 can have more or less links and/or ports. In one embodiment, link 212A couples the network element 202 and the network 208 is an uplink link and has a smaller physical link speed than the links 210B-C that couple the devices 206B-D to the network element 202. For example and in one embodiment, port 212A and link 210A have physical link speed of 10 gigabits/second (Gbps), whereas the downstream ports 212B-D and links 210B-D have a physical link speed of 20 Gbps.

As described above, and in one embodiment, any one of the ports 212A-D and associated links 210A-D can be overwhelmed with network data to the point that packets destined to be sent out the congested port are dropped or intolerably delayed instead of properly transmitted as a result of congestion. For example and in one embodiment, device 206A could transmit packets to network 208 at a rate greater than the physical link speed of the port 212A and link 210A can handle (e.g., greater than 10 Gbps). In this example, device 206A could cause the congestion on port 212A because device 206A is transmitting at a rate greater than 10 Gbps and one effect of this congestion would be to drop packets coming from device 206A. In another example and another embodiment, device 206C may be transmitting packets to the network 208 via port 212A and link 210A at a rate of 2 Gbps. Concurrently, device 206B transmits data at a rate of 9 Gbps to network 208 via port 212A and link 210A. Taken together, these data transmissions overwhelm the port 212A and, thus, packets from either device 206B and 206C may be dropped or marked as a result of congestion. Thus, the network data from both devices 206B-C are affected by the congestion at port 212A. In this example, if the system administrator had sufficient information about the traffic flow from devices 206B and 206C, the system administrator may determine that the cause of the is the network data from device 206B and the network data transmitted by devices 206B and 206C are affected by the network congestion on port 212A.

In one embodiment, the network element 202 includes a control plane 214 and data plane 216, where the control plane 214 controls and configures the forwarding decisions of the data plane 216 and the data plane 216 receives the network data on the ports 212A-D and transmits this network data out a corresponding destination port 212A-D. To store the network data for transmission, the network element 202 uses the queue groups 218A-D. In one embodiment, the data plane 216 stores the network data in a queue group 218A-D for the port 212A-D that is used for transmission. If there is no room in that queue group 218A-D to store a packet for transmission, the data plane 216 drops the packet and increments a counter on the data plane 216 that tracks dropped packets for each queue group 218A-D. In one embodiment, the counters access 220 of the control plane 214 allows access to the dropped packets counters of the network element (e.g., Simple Network Management Protocol (SNMP), command line interface (CLI), etc.).

In one embodiment, each queue group 218A-D is storage that is used to store packets of the network data for processing and/or forwarding. A queue group can be used to store packets that have been received on a port, store packets that awaiting transmission, and/or store packets waiting other processing (e.g., traffic shaping, applying QoS, forwarding decisions, security decisions, etc.). In one embodiment, each of the illustrated queue groups 218A-D can represent a single queue, multiple queues, a class of queues, or multiple classes of queues. In one embodiment, multiple different queues can be used for one port, where each individual queue can be used for the same or different purposes. For example and in one embodiment, multiple queues can be used for different QoS, traffic shaping, or other types of packet classifications (e.g., a queue for best effort QoS, a queue for a certain bandwidth guarantee, etc.). In a further embodiment, an illustrated queue group 218A-D includes a class of queues for each of the other ports 212A-D. In this embodiment, each of the class of queues can be one or more individual queues that are used to store packets for different classifications for packets that are destined to be transmitted out the port 212A-D.

Congestion in a queue group can cause packets to not be transmitted at all or not in a timely fashion. In one embodiment, a queue group congestion can cause a stored packet or a new enqueue packet to not be transmitted. In another embodiment, a queue group congestion can intolerably delay the transmission or cause jitter of stored or new enqueue packets. Greater latency and jitter for packet transmission can be a problem for certain applications that rely on low network latency and jitter and desire greater deterministic network performance (e.g., financial trading applications, media applications, audio/video applications, telephony applications, fire control, target telemetry, high performance computing, market data distribution, etc.).

In one embodiment, the control plane includes counters access 220, polling module 222, and storage 224. In one embodiment, the polling module 222 periodically polls the counters on the data plane 216 for dropped packets on each queue group 218A-D. As described above, the polling period of the polling module 222 can be on the order of tens of seconds, which can cause problems in determining when congestion on a port occurs, what caused this congestion, and what is affected by the congestion. The counters access 220 allows access to the dropped packets counters of the network element (e.g., SNMP, CLI, etc.). In one embodiment, the storage 224 is used to store results of polling module 222 and other information.

Figure 3:
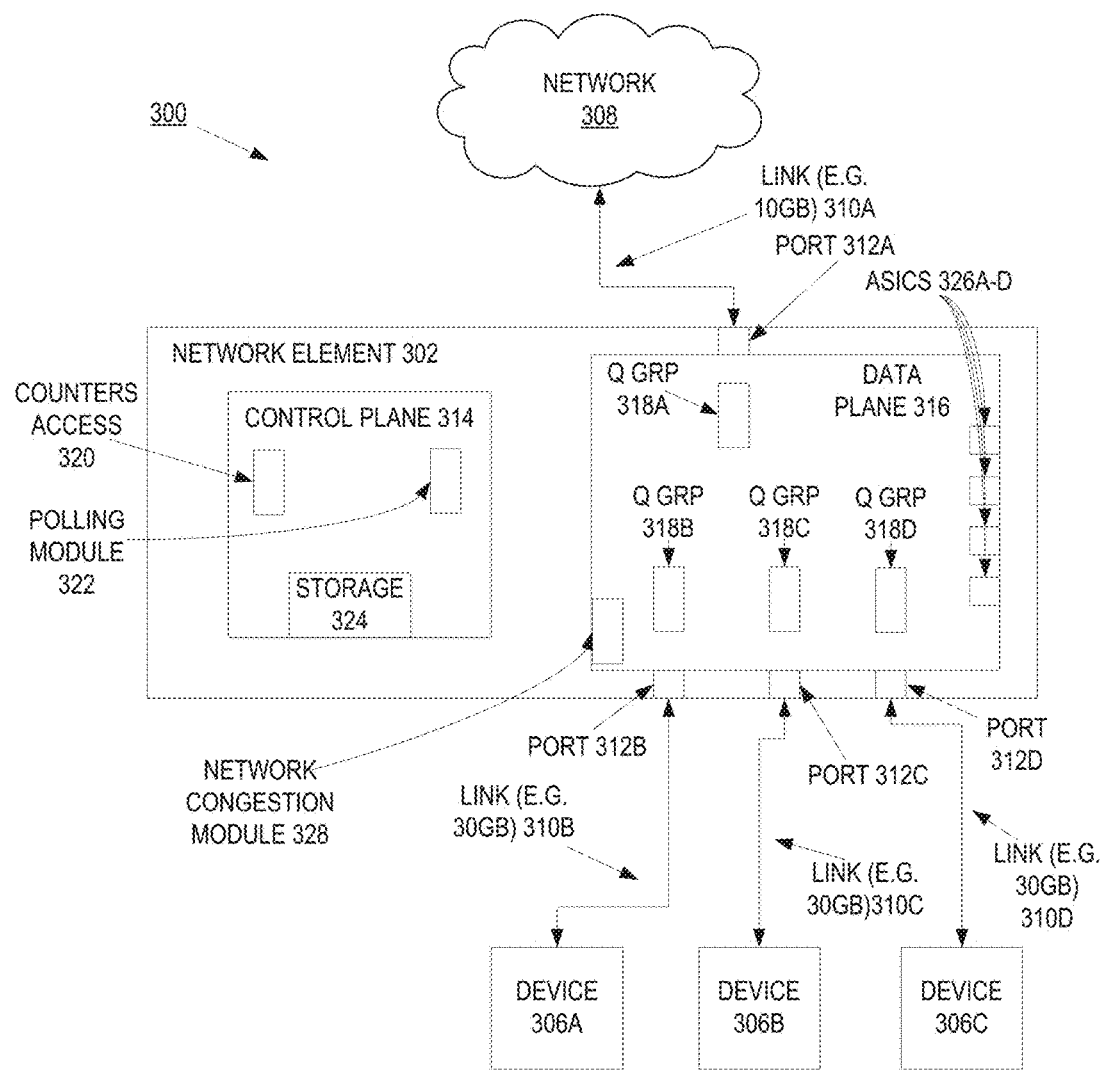
FIG. 3 is a block diagram of one embodiment of a system that includes a network element that communicates network data between a network and a number of devices, where the network element include a control plane and a data plane, and the data plane includes a number of queue groups and Application-Specific Integrated Circuits (ASICs) used to record queue group occupancy in near-real-time.

As described above, a counter polling method of detecting and detailing congestion has problems because the counter polling method can have significant lag in determining when the congestion is discovered and may not be able to adequately characterize the congestion. A way to overcome this problem is to monitor the occupancy of the queue groups in near real-time (e.g., within 800 microseconds) and collect information (and/or perform other actions) to determine the cause and effect of the congestion. FIG. 3 is a block diagram of one embodiment of a system 300 that includes a network element 302 that communicates network data between a network 308 and a number of devices 306A-C, where the network element 302 include a control plane 314 and a data plane 316 and the data plane 316, includes a number of ASICs 326A-D that are used to record queue group occupancy in near-real-time.

In one embodiment, queue group occupancy is a measure how many network element resources the queue group is using. Queue group occupancy can be measured using one or more different metrics, such as queue group depth, packet latency, number of buffers used, and/or number of buffer descriptors used. In one embodiment, the queue group depth is the number of bytes or packets that are in the queue group. This queue group depth can be a measure for an individual queue, or an aggregate of multiple queues.

In one embodiment, packet latency is the time from when the first bit of a packet hits the ingress port's transceiver to when the first bit hits the egress port's cable. In this embodiment, this type of packet latency can be called "first bit in to first bit out" latency. In one embodiment, first bit in to first bit out latency can be measured indirectly, for example, by setting up a packet loop and counting how many times the packet makes it around the loop in a period of time (e.g., 30 seconds). In this embodiment, the packet latency would be the period of time divided by counter value.

In another embodiment, packet latency can be estimated by measuring the queuing delay component of the packet latency, which is the amount of time the packet descriptor spends waiting in a queue for the egress port to be available. In one embodiment, this component is called "queuing delay." In one embodiment, the queuing delay contributes to the packet latency. Furthermore, in a congested network, the queuing delay can be the dominant component of the packet latency. In one embodiment, queuing delay is measured by timestamping the descriptor as the packet is placed in the queue, and subtracting this timestamp from the dequeue time of the packet.

In a further embodiment, the network element 302 can use a test packet or a "token" to measure packet latency. In this embodiment, the network element 302 inserts a special token is into the queue and records the time the token was inserted. When the token reaches the head of the queue, the network element 302 subtracts this time from the insertion time to determine the queuing delay for the token. In this embodiment, it may be that no actual packet experiences precisely that delay, but packets enqueued just before or just after the token probably experience latencies close to the token's latency. In one embodiment, this is called a "token delay" latency measure.

In one embodiment, the network element 302 tracks the depths (or sizes) of the queues. In one embodiment, the depth is measured in "buffers", where a buffer is an allocation unit within the ASIC. In one embodiment, the buffer can range from 50 to 500 bytes. As described above, the network element 302 can send notifications when the queue depth crosses a threshold. In one embodiment, while the queue depth is not really the same thing as queue or packet latency, a deeper queue does tend to result in more latency, so there is value in giving the customer visibility into queue depth. However, there are several factors weakening the relationship between latency and queue depth. For example and in one embodiment, lower-priority traffic has to wait for higher-priority traffic and thus might experience a larger delay even if all queues are small (assuming a continuous stream of high-priority traffic). As another example, flow control (e.g., 802.3x PAUSE) can prevent any transmission out a port, leading to large delays even with small queues. Finally, there is the issue of the actual occupancy of the buffers in the queue. For a queue with small sized buffers, a 64-byte packet introduces less latency for later packets than a 450-byte packet does. However, for a queue with 500-byte buffers, both get counted as one buffer.

In one embodiment, the number of buffers used is the number of buffers that are being used by the queue group 318A-D. In one embodiment, each queue group 318A-D allocates one or more buffers to store the packets. As with queue group depth, the number of buffers used can be for one queue group or for multiple queue groups. In one embodiment, the number of buffer descriptors is used represents another measure of how the network element 302 resources are being used and can be used for one queue group or for multiple queue groups.

While in one embodiment, the network element 302 is illustrated with four ports 312A-D and links 310A-D, in alternate embodiment, the network element 302 can have more or less links and/or ports. Similar to FIG. 2, network element 302 is coupled to the network 308 and devices 306A-D via links 310A-D and ports 312A-D, respectively. In one embodiment, link 312A, which couples the network element 302 and the network 308 is an uplink and have a smaller physical link speed than the links 312B-C that couple the devices 306B-D to the network element 302. For example and in one embodiment, port 312A and link 310A have physical link speed of 10 gigabits/second (Gbps), whereas the downstream ports 312B-D and links 310B-D have a physical link speed of 20 Gbps.

In one embodiment, the control plane 314 includes counters access 320, polling module 322, and storage 324. In one embodiment, the polling module 322 periodically polls the counters on the data plane 316 for dropped packets on each queue group 318A-D. As described above, the polling period of the polling module 322 can be on the order of tens of seconds, which can cause problems in determining when congestion on a port occurs, what caused this congestion, and what is affected by the congestion. The counters access 320 allows access to the dropped packets counters of the network element (e.g., SNMP, CLI, etc.). In one embodiment, the storage 324 is used to store results of polling module 322 and other information.

In addition, the network element 302 includes a control plane 314 and data plane 316, where the control plane 314 controls and configures the forwarding decisions of the data plane 316 and the data plane 316 receives the network data on the ports 312A-D and transmits this network data out a corresponding destination port 312A-D. The control plane includes counters access 320, polling module 322, and storage 324. The data plane includes queue groups 318A-D, ASICs 326A-D, and network congestion module 328. In one embodiment, the queue groups 318A-D store the network data for transmission for a corresponding port 312A-D.

In one embodiment, any one of the ports 312A-D and associated links 310A-D can be overwhelmed with network data to the point that packets destined to be sent out the congested port are dropped instead of transmitted. To detect the occupancy of the queue groups 318A-D in near real-time (e.g., within 800 microseconds), the data plans uses the ASICs 326A-D to store what the current queue group occupancy is for each queue group 318A-D. Thus, in near real-time, the queue group occupancy is known to the data plane 316. Consequently, by knowing the queue group occupancy in near real-time, the network element 302 can take actions to determine when congestion occurs for a port, what caused the congestion of the port, and/or what is the effect of the congestion of that port.

In one embodiment, the network congestion module 328 monitors the queue group occupancy stored in the ASICs 326A-D and performs actions based on the level of queue group occupancy in the queue group 318A-D. By measuring the queue group occupancy, in near real-time, a system administrator can have an idea when the congestion is about or has occurred. In one embodiment, the network congestion module 328 performs different actions based on different thresholds of queue group occupancy. In this embodiment, there are four different thresholds: a queue group occupancy tracking threshold; a sample occupants threshold; a sample new enqueue threshold; and a drop capture threshold. In one embodiment, the queue group occupancy tracking threshold is the lowest of the thresholds (e.g., lowest queue group occupancy), the sample occupants and sample new enqueue thresholds are the middle level thresholds, and the drop capture threshold is the highest level threshold. In one embodiment, if the queue group occupancy of a queue group 318A-D is greater than the queue group occupancy tracking threshold, the network congestion module 328 starts recording the queue group occupancy. This threshold is used to determine when to monitor the queue group occupancy prior to a potential congestion. In another embodiment, if the queue group occupancy of a queue group 318A-D is greater than the sample occupants threshold, the network congestion module 328 performs an action to collect information about the occupants of the this queue group 318A-D that can assist a system administrator determine what is a cause of a potential congestion on a port. In another embodiment, if the queue group occupancy of a queue group 318A-D is greater than the sample new enqueue threshold, the network congestion module 328 performs an action to collect information about new enqueue packets for the queue group that can assist a system administrator determine what is a cause of a potential congestion on a port. In a further embodiment, if the queue group occupancy of a queue group 318A-D is greater than the drop capture threshold, the network congestion module 328 performs an action to collect information that can assist a system administrator determine what is an effect of a congestion on a queue group 318A-D and/or alleviate the congestion for the queue group 318A-D. The different thresholds are described further below.

Figure 4:
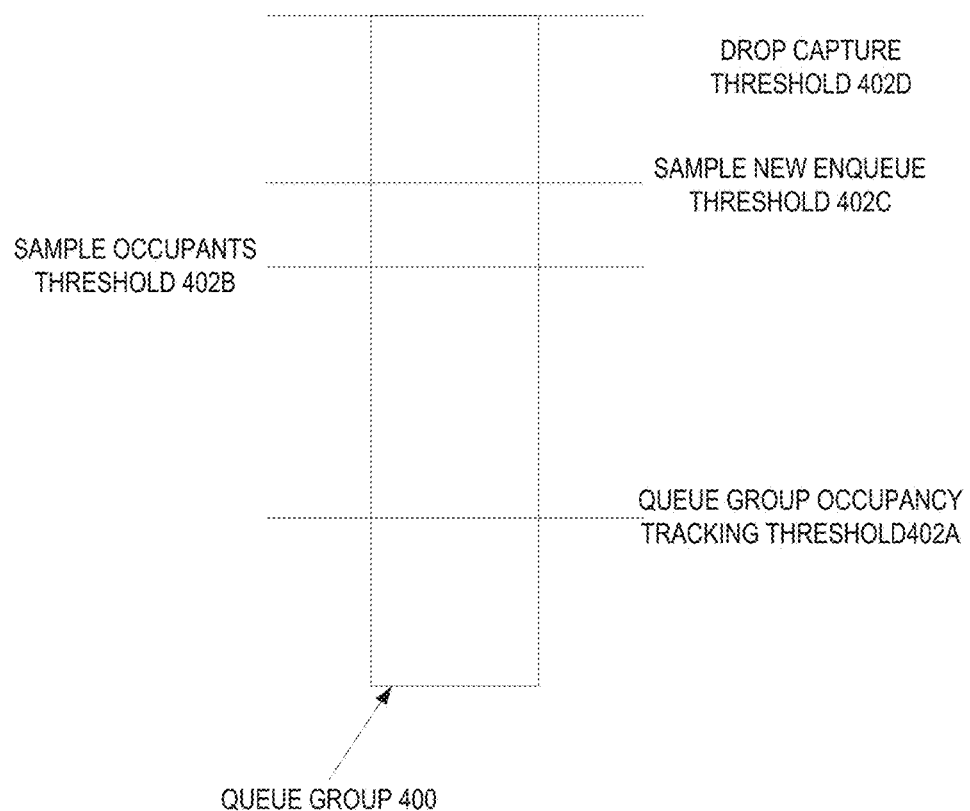
FIG. 4 is an illustration of a queue group and the different monitoring thresholds for that queue group.

FIG. 4 is an illustration of a queue group 400 and different monitoring thresholds 402A-D for that queue group 400. In one embodiment, a queue group 400 is storage that the network element uses to store packets for transmission. As described above, a queue group for a port can be an individual queue, multiple queues, a class of queues, or multiple classes of queues. Each individual queue can be a first-in, first-out queue, last in, first out queue, strict priority queue, egress queue, or another type of queue used for a port.

In one embodiment, a queue group occupancy of a queue group represents the amount of the queue group resources that are being used to store packets awaiting transmission. Queue group occupancy can be measured using one or more different metrics, such as queue group depth, packet latency, number of buffers used, and/or number of buffer descriptors used. If the network element stores a packet in the queue group, the queue group occupancy increases, whereas if a packet is de-queued from the queue group for transmission, the queue group occupancy decreases. In one embodiment, the network element stores the current queue group occupancy of a queue group in an ASIC in near real-time (e.g., within a delay of within 800 microseconds).

In one embodiment, there are four different thresholds 402A-D: a queue group occupancy tracking threshold 402A;

a sample occupants threshold 402B; a sample new enqueue threshold 402C; and a drop capture threshold 402D. In one embodiment, the queue group occupancy tracking threshold 402A is the lowest of the thresholds (e.g., lowest queue group occupancy), the sample occupants threshold 402B and the sample new enqueue threshold 402C are the middle level thresholds, and the drop capture threshold 402D is the highest level threshold. While in one embodiment, the order of the thresholds is (from lowest to highest) the queue group occupancy tracking threshold 402A, a sample new occupants threshold 402B, a sample new enqueue threshold 402C, and a drop capture threshold 402D, in alternate embodiments, the order of the threshold can be different and/or two or more of the thresholds may have the same value.

In one embodiment, the queue group occupancy can be a function of one or more different queue group resource metrics (e.g., queue depth, packet latency, number of buffers used, and/or number of buffer descriptors used). Each of these thresholds can be set for a particular value of the queue group occupancy. In one embodiment, if the queue group occupancy of a queue group is greater than the queue group occupancy tracking threshold 402A, the network congestion module 328 starts recording the queue group occupancy. By recording this queue group occupancy, the network congestion module 328 can record how the queue group 400 is utilized over time. In one embodiment, the recording of the queue group occupancy via the ASIC is performed with a periodicity that is smaller than the periodicity used by the control plane to poll the dropped counters. For example and in one embodiment, the periodicity is on the order of less than a millisecond (e.g., 800 microseconds) for the queue group occupancy recordation. In contrast, the recording of the dropped packet counters in on the order of tens of seconds. In one embodiment, by recording the queue group occupancy at this fine-grained level, the network congestion module 328 can detect the presence of microbursts that does not cause dropped or marked packets due to congestion. In this embodiment, a microburst for a port is a short burst of packets to be transmitted through one port. The microburst can cause congestion or the microburst data can be less than the physical link speed capacity of the port. In addition, the microburst can also interfere with other network data being transmitted out the port from other devices. In one embodiment, the burst time of a microburst can be of a short duration (e.g., less than one second). Using the fine-grained recordation of the queue group occupancy value allows for detect of a short duration burst of a microburst. Microbursts are further described in FIG. 5 below. In one embodiment, the queue occupancy tracking threshold 402A is used to determine when to monitor the queue group occupancy prior to a potential congestion. In one embodiment, if the queue group occupancy falls below the queue group occupancy tracking threshold 402A, the network congestion module 328 turns off the recording of the queue group occupancy. In one embodiment, the queue group occupancy tracking threshold 402A can be a threshold that is a threshold that is based on one of the metrics for the queue group occupancy (e.g., queue depth, packet latency, etc.) or can be a combination of two or more of the queue group occupancy metrics (e.g., queue depth and packet latency). In one embodiment, the queue group occupancy tracking threshold 402A for a queue group 400 is a queue group occupancy of less than 50% of the queue depth (e.g., 20% or 25%).

In one embodiment, once the queue group occupancy of the queue group 400 reaches the sample occupants threshold 402B, the network congestion module 328 can perform one or more of many different actions to characterize the packets stored in the queue group, and/or send a notification. In one embodiment, the network congestion module 328 gathers statistics about the packets occupying the queue group. For example and in one embodiment, the network congestion module 328 records the source address, packet type, other statistics (payload characteristics, destination address, etc.) for the stored packets, and/or a combination therein. In this example, the statistics regarding the stored packets can give the system administrator of the type of packets that is causing this queue group occupancy. In another embodiment, the network congestion module 328 can perform these actions on some or all of the packets in the queue group. For example and in one embodiment, the network congestion module 328 can gather statistics regarding packets that have a high priority and ignore other packets that have a lower priority. Alternatively, the network congestion module 328 can gather grater statistics regarding higher priority packets (e.g., address and packet type information) and less statistics for lower priority packets (e.g., packet counts). In one embodiment, the network congestion module 328 stores the gathered statistics in the storage 324. In a further embodiment, the network congestion module 328 copies some or all of the stored packets to the storage 324. In this embodiment, the network congestion module 328 creates a packet capture file that captures the packet information.

In a further embodiment, the network congestion module 328 sends a notification to the system administrator that the sample occupants threshold 402B has been reached for this queue group 400. In one embodiment, the notification includes information characterizing the type of data being stored (e.g., send a notification with a packet capture of the stored packets, statistics, and/or other type of information). In one embodiment, the notification can be an email, text, automated voice call, tweet, and/or any other type of notification. In one embodiment, once the queue group occupancy of queue group 400 falls below the sample occupants threshold 402B, the network congestion module 328 cancels the action that was setup in response to the queue group occupancy crossing the sample occupants threshold 402B.

In one embodiment, once the queue group occupancy of the queue group 400 reaches the sample new enqueues threshold 402C, the network congestion module 328 can perform one or more of many different actions to characterize the packets that are to be enqueued in the queue group. In one embodiment, the network congestion module 328 gathers statistics about the new enqueue packet. For example and in one embodiment, the network congestion module 328 records the source address, packet type, and/or other statistics (payload characteristics, destination address, etc.) for the new enqueue packets. In this example, the statistics regarding the new enqueue packets can give the system administrator an indication of the type of packets that is causing this level of queue group occupancy. In another embodiment, the network congestion module 328 can perform these actions of some or all of the new enqueue packets. For example and in one embodiment, the network congestion module 328 can gather statistics regarding packets that have a high priority and ignore other packets that have a lower priority. Alternatively, the network congestion module 328 can gather more statistics regarding higher priority packets (e.g., address and packet type information) and less statistics for lower priority packets (e.g., packet counts). In one embodiment, the network congestion module 328 stores the gathered statistics for the enqueued packets in the storage 324. In a further embodiment, the network congestion module 328 copies some or all of the stored packets to the storage 324. In this embodiment, the network congestion module 328 creates a packet capture file that captures the packet information. In a further embodiment, the network congestion module 328 sends a notification to the system administrator that the sample new enqueues threshold 402C has been reached for this queue group 400. In one embodiment, the notification includes information characterizing the type of data being stored (e.g., send a notification with a packet capture of the stored packets, statistics, and/or other type of information). In one embodiment, the notification can be an email, text, automated voice call, tweet, and/or any other type of notification. In one embodiment, once the queue group occupancy of queue group 400 falls below the sample new enqueues threshold 402C, the network congestion module 328 cancels the action that was setup in response to the queue group occupancy crossing the sample new enqueues threshold 402C.

In a further embodiment, if the queue group occupancy of a queue group 400 is equal to or greater than the drop capture threshold 402D, the network congestion module 328 performs one or more actions to alleviate the congestion and/or collect information that can assist a system administrator determine what is an effect of a congestion on a port. In one embodiment, the drop capture threshold 402D is a threshold that is a threshold that is based on one of the metrics for the queue group occupancy (e.g., queue depth, packet latency, etc.) or can be a combination of two or more of the queue group occupancy metrics (e.g., packet latency and number of buffers used). In one embodiment, the drop capture threshold 402D is 100% queue group occupancy or below 100% queue group occupancy, where the queue group 400 is in a condition that the queue group 400 cannot store another packet. In another embodiment, the drop capture threshold 402D is a threshold that is configured to be at a point of the queue occupancy in which the administrator feels that congestion has occurred (e.g., if the queue latency is greater than a particular time limit).

In one embodiment, the network congestion module 328 can drop the enqueued new packets, drop the stored packets, do a packet capture of the new enqueue packets, do a packet capture of the stored packets, and/or perform another action. For example and in one embodiment, the network congestion module 328 drops some or all of the stored packets for this queue group. By dropping the packets in the queue group, new enqueue packets can be stored in the queue group for transmission instead of dropping these packets. In one embodiment, the network congestion module 328 drops lower priority packets and leaves the higher priority packets in the queue group. In this embodiment, the network congestion module 328 can selectively drop the packets based on a characteristic of the stored packets. In a further example and in one embodiment, the network congestion module 328 drops some or all of the new enqueue packets for this queue group. By dropping the new enqueue packets for this queue group, subsequent packets can be stored in the queue group for transmission instead of being dropped. In one embodiment, the network congestion module 328 drops lower priority new enqueue packets and leaves the higher priority new enqueue packets in the queue group. In this embodiment, the network congestion module 328 can selectively drop the new enqueue packets based on a characteristic of these packets.

In another embodiment, the network congestion module 328 performs a packet capture of the stored and/or new enqueued packets. In this embodiment, the network congestion module 328 snapshots the queue group for a period, save to persistent storage (e.g., storage 324 of FIG. 3 above), and tag this snapshot with the device name and port identifier of where the congestion even occurred. In one embodiment, the network congestion module 328 subsamples this snapshot that allows a system administrator to get an indication of the stored and/or new enqueue packets. In another example and embodiment, network congestion module 328 can create a real-time micro Transmission Control Protocol (TCP) dump snapshot that gives a 1:1 packet view into what is going into the buffer while the buffer was congested. In one embodiment, the microdump snapshot may be a smaller snapshot than the buffer snapshot above, but would allow for greater depth of information.

In one embodiment, the information collected (e.g., the packet capture) is for the effect of the congestion, instead of the information that may indicate the cause of the congestion. In a further embodiment, the network congestion module 328 copies some or all of the stored packets to the storage 324. In this embodiment, the network congestion module 328 creates a packet capture file that captures the packet information.

In an alternate embodiment, the network congestion module 328 can alleviate the congested queue group occupancy by sending the stored packets and/or new enqueue packets out a different port. In this embodiment, the network congestion module 328 forwards packets that are stored from queue group 400 to another port that has a lower utilization. For example and in one embodiment, the network congestion module 328 can forward the stored packets out another port that allows the stored packets to arrive at the packet destination. In another embodiment, the network congestion module 328 can forward new enqueue packets out another port. In a further embodiment, the network congestion module 328 sends a notification to the system administrator that the drop capture threshold 402D has been reached for this queue group 400. In one embodiment, the notification includes information characterizing the type of data being stored (e.g., send a notification with a packet capture of the stored packets, statistics, etc.). In one embodiment, the notification can be an email, text, automated voice call, tweet, and/or any other type of notification. In one embodiment, once the queue group occupancy falls below the drop capture threshold 402D, the network congestion module 328 cancels the action that was setup in response to the queue group occupancy crossing the drop capture threshold 402D and reverts to the actions performed in response to the queue group occupancy being above the congestion causation threshold 402B.

As described above, the network congestion module 328 can use one or more of the four thresholds 402A-D to characterize the network data that is being utilized by the queue group 402. In one embodiment, an administrator can configure these thresholds, so that the actions performed in response the threshold being met can characterize the cause and/or effect of the congestion, as well as alleviate the congestion in near-real time. In one embodiment, the network congestion module 328 can use one, some, or all of the four thresholds (queue group occupancy tracking threshold, sample occupants threshold, sample new enqueues threshold, and drop capture threshold) to characterize the queue group occupancy of the queue group. For example and in one embodiment, the network congestion module 328 can use one or more of the thresholds, such as the drop capture threshold, to determine an effect of congestion of a queue group. In this embodiment, if the queue group occupancy is at a point of congestion, the actions performed in response to the queue group occupancy above this level will give an indication of the effect of the congestion and/or alleviate the effect of the congestion. For example and in one embodiment, if congestion is indicted as a queue depth at 100%, an administrator may configure the drop packet threshold for 100% queue depth, sample new enqueues at 85% queue depth, sample new occupants at 80% queue depth, and queue occupancy tracking threshold at 25% queue depth. In this example, if the queue occupancy reaches at 100% queue depth, the actions performed in response to the queue depth will give an indication of the effect of the congestion. In addition, actions may be performed to alleviate this congestion (e.g. dropping stored and/or new enqueue packets, changing the destination port for stored and/or new enqueue packets, etc.).

In another embodiment, the network congestion module 328 can use another one or more of the thresholds, such as the either sample threshold and/or the queue occupancy tracking threshold, to determine a causation of the congestion. In this embodiment, if the queue group occupancy approaching a point of congestion, the actions performed in response to the queue group occupancy above this level will give an indication of a cause of the congestion. In one embodiment, the thresholds can be one or more of the queue occupancy tracking threshold, sample occupants threshold, sample new enqueues threshold, and drop capture threshold. In this embodiment, each of these thresholds can trigger different actions in response to a queue occupancy approaching a congestion of that queue group. For example and in one embodiment, if congestion is indicted as a queue depth at 100%, an administrator may configure the sample new enqueues at 85% queue depth, sample new occupants at 80% queue depth, and queue occupancy tracking threshold at 25% queue depth. In this example, if the queue occupancy reaches at 80 or 85% queue depth, the actions performed in response to the queue depth will give an indication of the effect of the congestion. In addition, if the drop capture threshold is set to this level, actions may be performed to alleviate this congestion (e.g. dropping stored and/or new enqueue packets, changing the destination port for stored and/or new enqueue packets, etc.).

Figure 5:
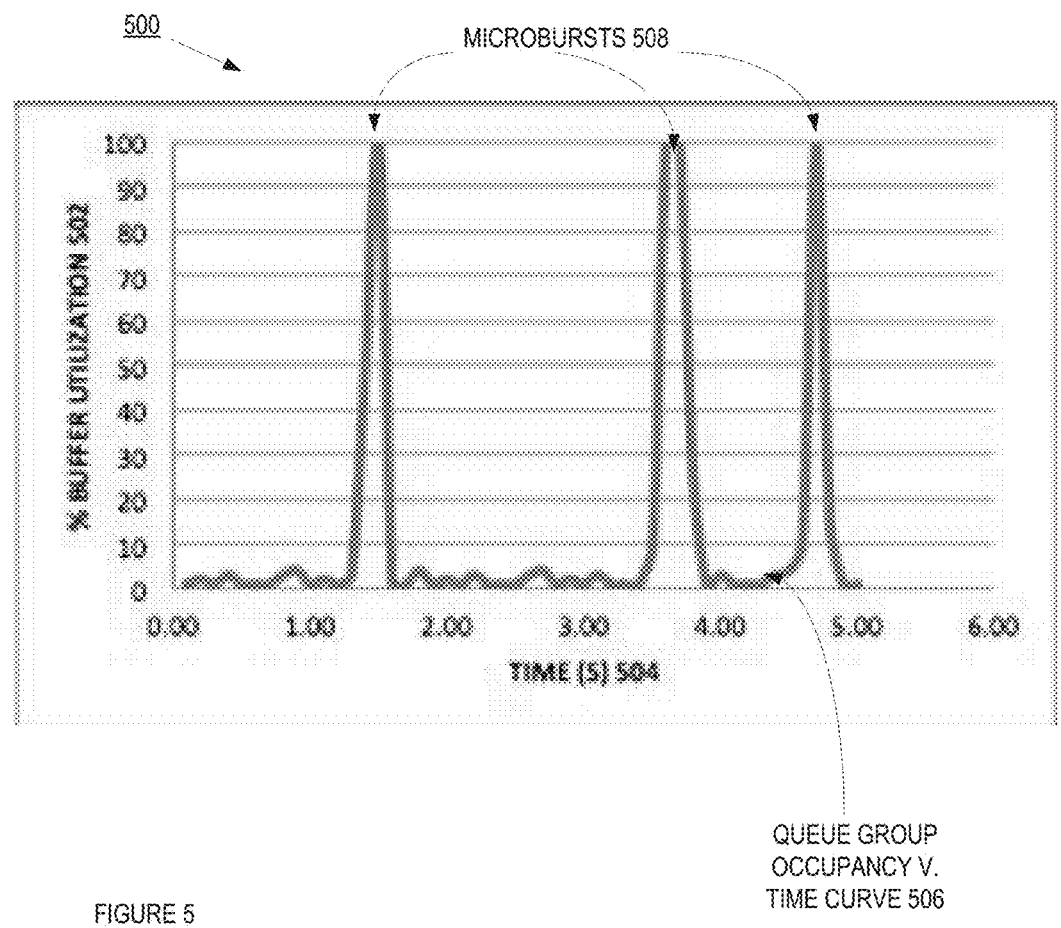
FIG. 5 is an illustration of a queue group occupancy vs. time curve, where this curve illustrates microbursts in the queue group occupancy.

FIG. 5 is an illustration of queue group occupancy vs. time curve 506, where this curve 506 illustrates microbursts 508 in the queue group occupancy. In FIG. 5, the queue group occupancy vs. time curve 506 is a curve that plots the queue group occupancy 502 over time 504. In one embodiment, the curve 506 represents a fine-grained view of how a queue group is used over time. For example and in one embodiment, the queue group occupancy is sampled on a period of less than one millisecond (e.g., a period of 800 microseconds). Because of the small sampling period, the curve 506 illustrates microbursts. As described above, a microburst 506 is a period of congestion that is a short burst of network data that creates a short period of congestion on a port. In one embodiment, the width of microburst is smaller than the polling period of the dropped packet counters, which can makes the microburst undetectable using a polling method to detect congestion. In one embodiment, a microburst can congest a queue group, and causing a dropping of subsequent packets that are to be transmitted out the port corresponding to the congested port.

Figure 6A:
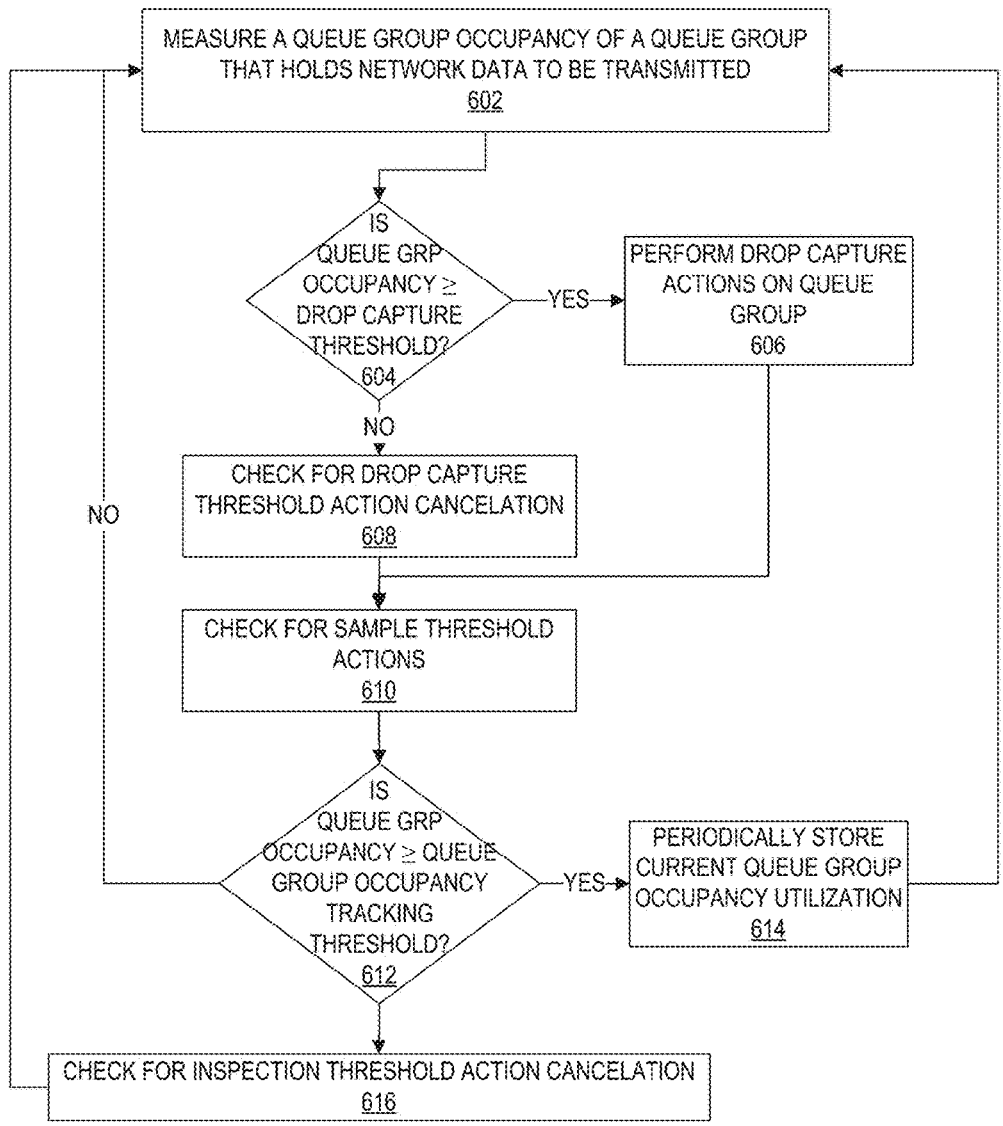
FIG. 6A is a flow diagram of one embodiment of a process that monitors a queue group occupancy of a port queue group and performs an action if one of the thresholds is reached.

FIG. 6A is a flow diagram of one embodiment of a process 600 that monitors a queue group occupancy of a port queue group and performs an action if one of the thresholds is reached. In one embodiment, a network congestion module performs process 600 to monitor a queue group occupancy and perform one or more actions if one of the thresholds is reached, such as the network congestion module 328 of the network element 302 as described in FIG. 3 above. In FIG. 600, process 600 begins by measuring a queue group occupancy of the queue group that holds the network data to be transmitted at block 602. In one embodiment, process 600 measures the queue group occupancy by retrieving the queue group occupancy value from an ASIC on the data plane of the network element. In this embodiment, the current queue group occupancy is periodically stored in the ASIC and process 600 retrieves the stored value. For example and in one embodiment, storing the queue occupancy is described in U.S. patent application Ser. No. 13/420,527, entitled "Latency Analysis of Traffic Passing Through an Ethernet Switch", filed on Mar. 14, 2012 and incorporated by reference.

At block 604, process 600 determines if the queue group occupancy is greater than or equal to a drop capture threshold. In one embodiment, the drop capture threshold is a threshold that indicates that the queue group is fully occupied and that this queue group cannot store any further packets at this time. In one embodiment, the drop capture threshold is at 100% queue group occupancy or below 100% queue group occupancy, where the queue group is in a condition that the queue group cannot or should not store another packet (e.g., queue latency is too great). If the queue group occupancy is not greater than the congestion causation threshold, execution proceeds to block 608 below.

If the queue group occupancy is greater than or equal to the drop capture threshold, at block 606, process 600 performs one or more actions. For example and in one embodiment, process 600 can drop the enqueued new packets, drop the stored packets, do a packet capture of the new enqueue packets, do a packet capture of the stored packets, and/or perform another action as described in FIG. 4 above. In a further embodiment, process 600 copies some or all of the stored packets to the storage. In this embodiment, process 600 creates a packet capture file that captures the packet information.

In a further alternate embodiment, process 600 can alleviate the congested queue group occupancy by sending the stored packets and/or new enqueue packets out a different port. In this embodiment, process 600 forwards packets that are stored from queue group to another port that has a lower occupancy. For example and in one embodiment, process 600 can forward the stored packets out another port that allows the stored packets to arrive at the packet destination. In another embodiment, process 600 can forward new enqueue packets out another port. In an alternate embodiment, process 600 can drop one, some, or all of the stored packets, so as to make room for other packets that are to be stored in the queue group. For example and in one embodiment, process 600 can drop lower priority stored packets from a lower priority queue instead of high priority packets. In a further embodiment, process 600 sends a notification to the system administrator that the drop capture threshold has been reached for this queue group. In one embodiment, the notification includes information characterizing the type of data being stored (e.g., send a notification with a packet capture of the stored packets, statistics, etc.). In one embodiment, the notification can be an email, text, automated voice call, tweet, and/or any other type of notification.

As an example and in another embodiment, a trading server is coupled to the network element and the trading server is receiving data and making financial trades with a financial exchange based on the received data. In this embodiment, the trading server sends the financial trade requests via a port of the network element that is congested. The network element detects this congestion of the port by measuring the queue group occupancy of the queue group for that port. In addition, instead of forwarding the packets from the trading server via the congested port, the network element forwards these packets out another port. In one embodiment, the network element forwards these packets via a port that can reach the current financial exchange. In another embodiment, the network element forwards these packets out another port to a different financial exchange to make the financial trades.

If the queue group occupancy is less than the drop capture threshold, at block 608, process 600 checks drop capture threshold action cancelation. In one embodiment, process 600 determines if actions were setup in response to the queue group occupancy crossing the drop capture threshold. If an action was setup, process 600 cancels this action because the queue group occupancy of this queue group is below the drop capture threshold. For example and in one embodiment, if process 600 previously setup a packet capture of stored packet in response to the queue group occupancy crossing the drop capture threshold and the current queue group occupancy is less than the drop capture threshold, process 600 cancels this packet capture.

At block 610, process 600 checks for a sample threshold action. In one embodiment, a sample threshold in either the sample occupants or sample new enqueues threshold as described in FIG. 4 above. Process 600 checks if one of the sample thresholds is achieved, and performs or cancels an action if one of the thresholds were crossed. Checking for a sample threshold is further described in FIG. 6B below.

At block 612, process 600 determines if the queue group occupancy is greater than or equal to a queue group occupancy tracking threshold. In one embodiment, the queue group occupancy tracking threshold is a threshold at which process 600 starts recording the queue group occupancy and is used to determine when to monitor the queue group occupancy prior to a potential congestion. In addition, the queue group occupancy tracking threshold is used by process 600 to record the queue group occupancy. In one embodiment, the queue group occupancy tracking threshold is less than 50% (e.g., 20% or 25% of a queue depth, small queue latency, etc.). If the queue group occupancy is greater than the queue group occupancy tracking threshold, at block 614, process 600 periodically records the current queue group occupancy. In one embodiment, process 600 records the current queue group occupancy in near real-time (e.g. every 800 microseconds). Execution proceeds to block 602 above. If the queue group occupancy is not above the queue group occupancy tracking threshold, at block 620, process 600 checks for a queue group occupancy tracking threshold action cancelation. In one embodiment, process 600 determines if a recording of the queue group occupancy was setup in response to a previous to the queue group occupancy crossing the queue group occupancy tracking threshold. If queue group occupancy recording was setup, process 600 cancels this action because the queue group occupancy of this queue group is currently below the queue group occupancy tracking threshold. Execution proceeds to block 602 above.

Figure 6B:
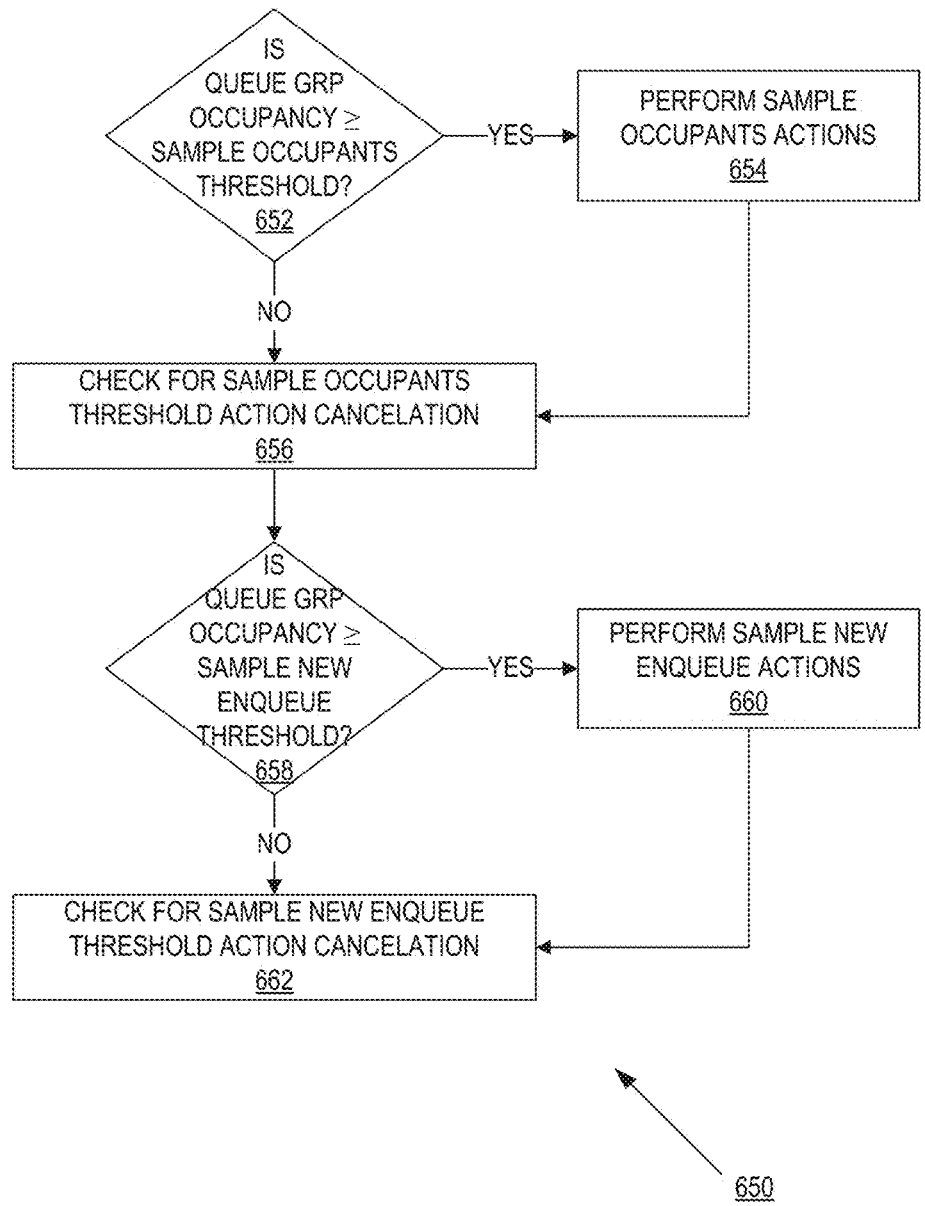
FIG. 6B is a flow diagram of one embodiment of a process that performs an action if one of the sample thresholds is reached.

FIG. 6B is a flow diagram of one embodiment of a process 650 that performs an action if one of the sample thresholds is reached. In one embodiment, process 650 is performed by process 600 at block 610 of FIG. 6A above to check for sample threshold actions. In one embodiment, the sample action thresholds are the sample occupants and the same new enqueue packets thresholds as described above in FIG. 4. In one embodiment, either of these thresholds can be configured to be close to full occupancy (e.g., 80% or greater). Once the queue group occupancy hits either of these thresholds at this configuration, if the queue group occupancy continues to increase, the queue group and associated port will be congested. Thus, this threshold may serve as a warning that congestion may occur for this queue group. In addition, the network data filling this queue group may be an indication of the potential congestion.

In FIG. 6B, process 650 begins by checking if the queue group occupancy is equal to or greater than the sample occupants threshold at block 652. If the queue group occupancy is greater than or equal to the sample occupants threshold, at block 654, process 650 performs one or more actions than can be performed for this threshold. For example and in one embodiment, process 652 can perform one or more of many different actions to characterize the packets occupying in the queue group, and/or send a notification as described above in FIG. 4. Execution proceeds to block 656 below. If the queue group occupancy a below the sample occupants threshold, execution proceeds to block 656 below. At block 656, process 650 checks for sample occupants threshold action cancelation. In one embodiment, process 650 determines if actions were setup in response to a previous to the queue group occupancy crossing the sample occupants threshold (e.g., gathering statistics about stored packets, or other actions described above, etc.). If an action was setup, process 650 cancels this action because the queue group occupancy of this queue group is below the sample occupants threshold. For example and in one embodiment, if process 650 previously setup a gathering of statistics in response to the queue group occupancy crossing the sample occupants threshold and the current queue group occupancy is less than the sample occupants threshold, process 650 cancels the gathering of the statistics.

At block 658, process 650 checks if the queue group occupancy is equal to or greater than the sample new enqueues threshold. If the queue group occupancy is greater than or equal to the sample new enqueues threshold, at block 660, process 650 performs one or more actions than can be performed for this threshold. For example and in one embodiment, process 652 can perform one or more of many different actions to characterize the packets that will be enqueued in this queue group, and/or send a notification as described above in FIG. 4. Execution proceeds to block 662 below. If the queue group occupancy falls below the sample new enqueues threshold, execution proceeds to block 662 below. At block 662, process 650 checks for sample new enqueues threshold action cancelation. In one embodiment, process 650 determines if actions were setup in response to a previous to the queue group occupancy crossing the sample new enqueues threshold (e.g., gathering statistics about stored packets, or other actions described above, etc.). If an action was setup, process 650 cancels this action because the queue group occupancy of this queue group is below the sample new enqueues threshold. For example and in one embodiment, if process 650 previously setup a gathering of new enqueue statistics in response to the queue group occupancy crossing the sample new enqueues threshold and the current queue group occupancy is less than the sample new enqueues threshold, process 650 cancels the gathering of the statistics.

Figure 7:
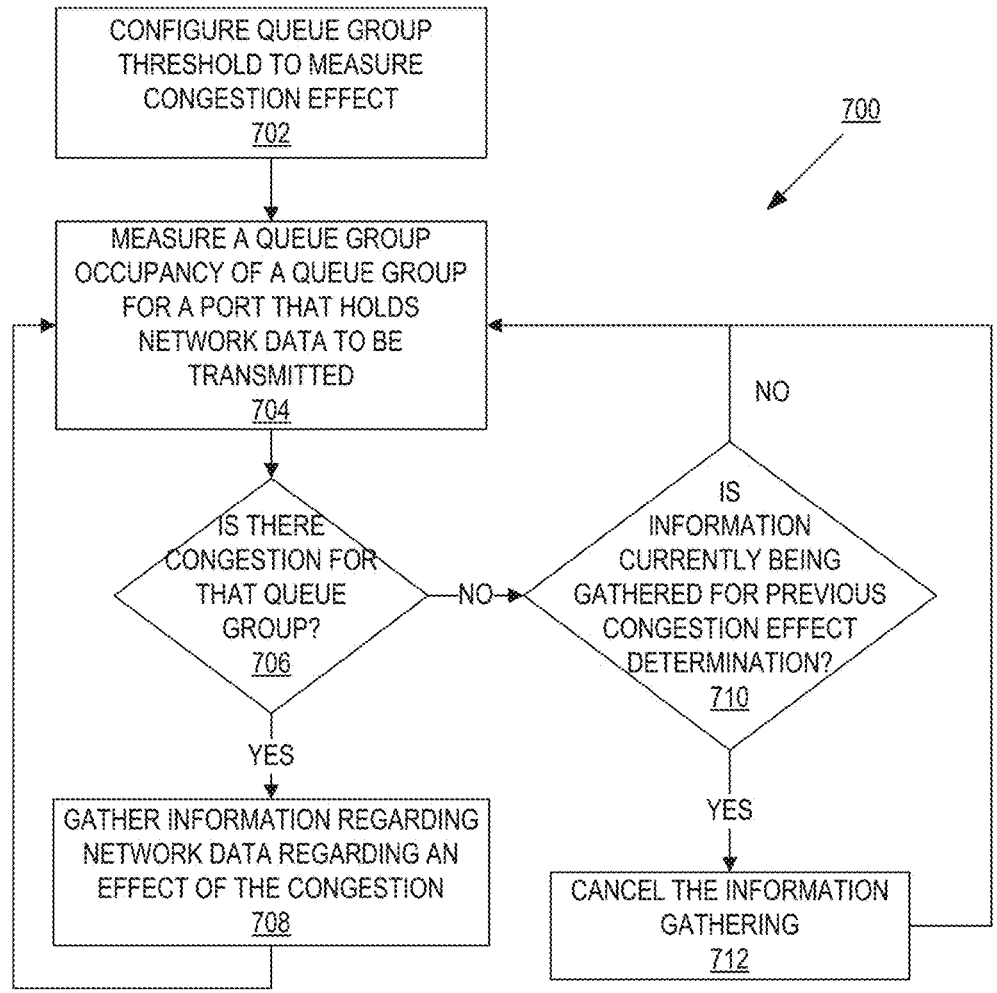
FIG. 7 is a flow diagram of one embodiment of a process that determines an effect of congestion.

As described above, process 600 describes a process that uses four different threshold to monitor, gather statistics, and perform other actions is response to different levels of queue group occupancy of a queue group. In one embodiment, the network element can use one, some, or all of the four thresholds (queue group occupancy tracking threshold, sample occupants threshold, sample new enqueues threshold, and drop capture threshold) to characterize the queue group occupancy of the queue group. For example and in one embodiment, the network element can use one or more of the thresholds, such as the drop capture threshold, to determine an effect of congestion of a queue group. In this embodiment, if the queue group occupancy is at a point of congestion, the actions performed in response to the queue group occupancy above this level will give an indication of the effect of the congestion and/or alleviate the effect of the congestion. FIG. 7 is a flow diagram of one embodiment of a process 700 that determines an effect of congestion. In one embodiment, a network congestion module performs process 700 to determine an effect, such as the network congestion module 328 of the network element 302 as described in FIG. 3 above. In FIG. 7, process 700 begins by configuring one or more queue group thresholds that can be used to measure the effect of congestion. In one embodiment, the thresholds can be one or more of the queue occupancy tracking threshold, sample occupants threshold, sample new enqueues threshold, and drop capture threshold. In this embodiment, each of these can trigger different actions in response to a queue occupancy indicating a congestion of that queue group. For example and in one embodiment, if congestion is defined as a queue depth at 100%, an administrator may configure the drop packet threshold for 100% queue depth, sample new enqueues at 85% queue depth, sample new occupants at 80% queue depth, and queue occupancy tracking threshold at 25% queue depth. In this example, if the queue occupancy reaches at 100% queue depth, the actions performed in response to the queue depth will give an indication of the effect of the congestion. In addition, actions may be performed to alleviate this congestion (e.g. dropping stored and/or new enqueue packets, changing the destination port for stored and/or new enqueue packets, etc.).

At block 704, process 700 measures a queue group occupancy of the queue group that holds packets to be transmitted. In one embodiment, process 700 measures the queue group occupancy by retrieving the queue group occupancy value from an ASIC on the data plane of the network element. In this embodiment, the current queue group occupancy is periodically stored in the ASIC and process 700 retrieves the stored value.

At block 706, process 700 determines if there is congestion for that queue group. In one embodiment, process 700 determines if there is queue group congestion by determining if the queue group occupancy of that queue group is greater than or equal to a threshold that indicates congestion. In one embodiment, the drop capture threshold can be configured to indicate congestion. For example and in one embodiment, the drop capture threshold is configured to be at 100% queue group occupancy or below 100% queue group occupancy, where the queue group is in a condition that the queue group cannot (or should not) store another packet (e.g., queue latency is too high). If the queue group occupancy does not indicate a congestion condition, execution proceeds to block 710 below.

If there is congestion for the queue group, process 700 gathers information and/or performs other actions for this queue group at block 708. In one embodiment, process 700 can perform one or more of many different actions to characterize the stored packets, characterize new enqueue packets, send a notification, and/or alleviate the actual congestion. Which actions are performed depends on which of the different thresholds are reached and which of the different actions are configured to be performed if the thresholds are reached. For example and in one embodiment, process 700 performs one or more actions as described above in FIG. 4. Execution proceeds to block 704 above.

At block 710, process 700 determines if information is currently being gathered (or performing any other action) in response to a previous congestion effect determination. In one embodiment, process 700 determines if actions were setup in response to a previous to the queue group occupancy crossing the drop capture threshold (e.g., gathering statistics about stored packets, or other actions described above, etc.). If information is currently being gathered (or another action being performed) in response to a previous congestion effect determination, at block 712, process cancels this information gathering (and/or any other action being performed in response to a previous congestion effect determination). In one embodiment, the information gathering and/or other action is canceled because there is no further congestion for that queue group. Execution proceeds block 704 above.

Figure 8:
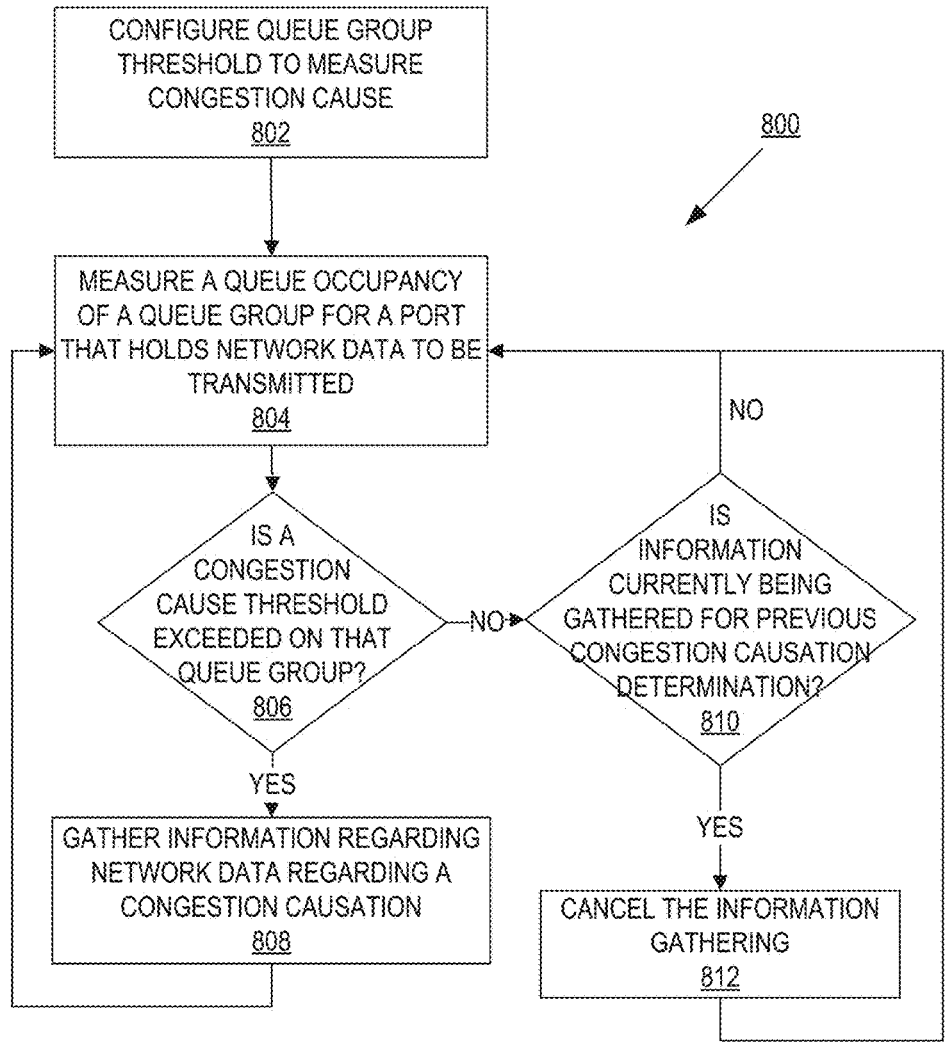
FIG. 8 is a flow diagram of one embodiment of a process that determines a cause of congestion.

In one embodiment, the network element can use another one or more of the thresholds, such as the either sample threshold and/or the queue occupancy tracking threshold, to determine a causation of the threshold. In this embodiment, if the queue group occupancy approaching a point of congestion, the actions performed in response to the queue group occupancy above this level will give an indication of a cause of the congestion. FIG. 8 is a flow diagram of one embodiment of a process 800 that determines a cause of congestion. In one embodiment, a network congestion module performs process 800 to determine an effect, such as the network congestion module 328 of the network element 302 as described in FIG. 3 above. In FIG. 8, process 800 begins by configuring a queue group threshold to measure a congestion cause at block 802. In one embodiment, the thresholds can be one or more of the queue occupancy tracking threshold, sample occupants threshold, sample new enqueues threshold, and drop capture threshold. In this embodiment, each of these can trigger different actions in response to a queue occupancy approaching a congestion of that queue group. For example and in one embodiment, if congestion is indicted as a queue depth at 100%, an administrator may configure the sample new enqueues at 85% queue depth, sample new occupants at 80% queue depth, and queue occupancy tracking threshold at 25% queue depth. In this example, if the queue occupancy reaches at 80 or 85% queue depth, the actions performed in response to the queue depth will give an indication of the effect of the congestion. In addition, if the drop capture threshold is set to this level, actions may be performed to alleviate this potential congestion (e.g. dropping stored and/or new enqueue packets, changing the destination port for stored and/or new enqueue packets, etc.).

At block 804, process 800 measures a queue group occupancy of the queue group that holds the stored packets at block 802. In one embodiment, process 800 measures the queue group occupancy by retrieving the queue group occupancy value from an ASIC on the data plane of the network element. In this embodiment, the current queue group occupancy is periodically stored in the ASIC and process 800 retrieves the stored value.

At block 804, process 800 determines if there is a potential for congestion for that queue group. In one embodiment, process 800 determines if there is a potential for congestion by determining if the queue group occupancy of that queue group is greater than or equal to a threshold that indicates a potential for congestion. For example and in one embodiment, the sample occupants and/or sample new enqueues threshold can be configured to indicate that there is potential congestion in the queue group. In one embodiment, this threshold is closer to full occupancy (e.g., 80% or greater of one or more of the queue group occupancy metrics). Once the queue group occupancy hits this threshold, if the queue group occupancy continues to increase, the queue group and associated port will be congested. Thus, these threshold(s) can serve as a warning that congestion may occur for this queue group. In addition, the network data filling this queue group may be an indication of the potential congestion. If the queue group occupancy is not greater than the congestion causation threshold, execution proceeds to block 808 below.

If there is a potential for congestion for the queue group, process 800 gathers information regarding the stored and/or new enqueue packets at block 808. In one embodiment, process 800 can perform one or more of many different actions to characterize the stored packets, characterize packets to be stored, and/or alleviate the potential congestion. Which actions are performed depends on which of the different threshold are reached and which of the different actions are configured to be performed if the thresholds are reached. For example and in one embodiment, process 800 performs one or more actions as described above in FIG. 4. Execution proceeds to block 804 above.

At block 810, process 800 determines if information is currently being gathered (or performing any other action) in response to a previous congestion potential determination. In one embodiment, process 800 determines if actions were setup in response to a previous to the queue group occupancy crossing the congestion causation threshold (e.g., gathering statistics about stored packets, or other actions described above, etc.). If information is currently being gathered (or another action being performed) in response to a previous congestion potential determination, at block 812, process 800 cancels this information gathering (and/or any other action being performed in response to a previous congestion effect determination. In one embodiment, the information gathering and/or other action is canceled because there is no current potential for congestion for that queue group and the current queue occupancy is below one or more of the configured thresholds. Execution proceeds block 804 above.

The processes of FIGS. 7 and 8 can be used to determine a cause and effect of congestion for a queue group. For example and in one embodiment, these processes can snapshot the queue group for a period before and after the congestion event (e.g., 30 seconds prior and after the congestion event), save to persistent storage (e.g., storage 324 of FIG. 3 above), and tag this snapshot with the device name and port identifier of where the congestion even occurred. In one embodiment, this snapshot is subsampled and allows a system administrator to get an indication of the cause and effect of the congestion. In another example and embodiment, process 600 can create a real-time micro Transmission Control Protocol (TCP) dump snapshot that gives a 1:1 packet view into what is going into the queue group while the queue group was congested. In one embodiment, the microdump snapshot may be a smaller snapshot than the queue group snapshot above, but would allow for greater depth of information.

Figure 9A:
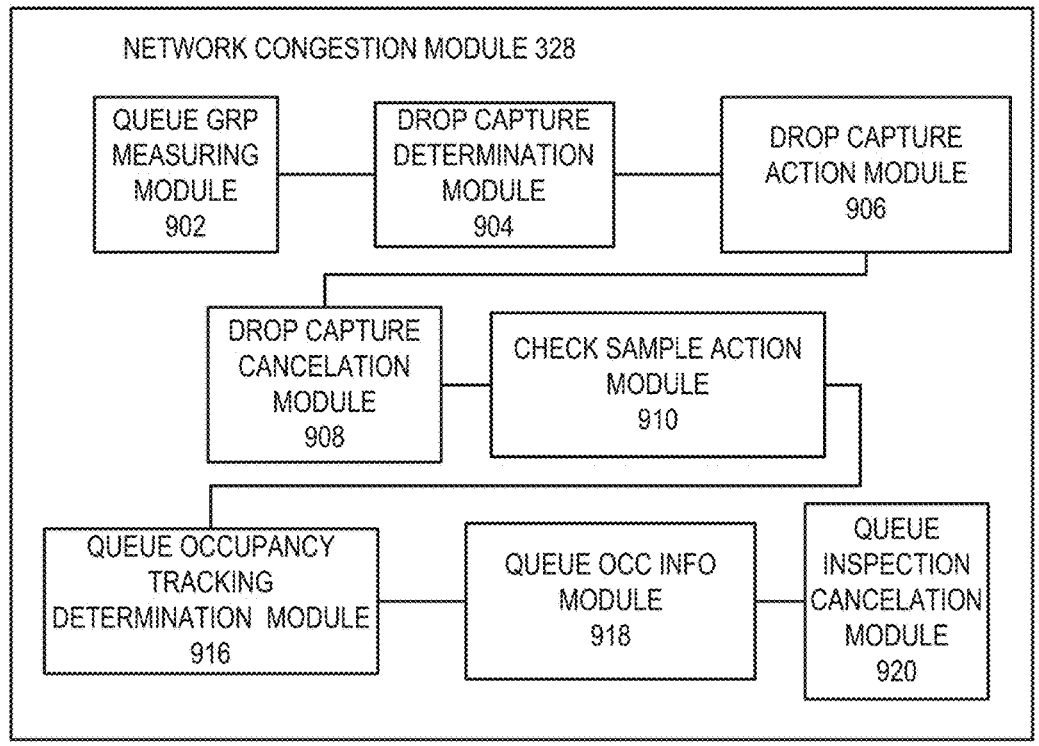
FIG. 9A is a block diagram of a network congestion module that monitors a queue group occupancy to determine a cause and/or effect of congestion.

FIG. 9A is a block diagram of a network congestion module 328 that monitors a queue group occupancy to determine a cause and/or effect of congestion. In one embodiment, the network congestion module 328 includes a queue group measuring module 902, drop capture determination module 904, drop capture action module 906, drop capture cancelation module 908, check sample action module 910, queue group occupancy tracking determination module 912, queue group occupancy information module 914, and queue group inspection cancelation module 916. In one embodiment, the queue group measuring module 902 measures the queue group occupancy as described in FIG. 6A, block 602 above. The drop capture determination module 904 determines if the queue group occupancy is greater than or equal to a drop capture threshold as described in FIG. 6A, block 604 above. The drop capture action module 906 performs one or more actions in response to the queue occupancy being equal to or above the drop capture threshold as described in FIG. 6A, block 606 above. The drop capture cancelation module 908 checks for a drop capture threshold action cancelation as described in FIG. 6A, block 608 above. The check sample action module 910 checks for a sample action as described in FIG. 6A, block 610 above. The queue group occupancy tracking determination module 912 determines if the queue group occupancy is greater than or equal to queue group occupancy tracking threshold as described in FIG. 6A, block 612 above. The gather queue group occupancy information module 914 gathers queue group occupancy values as described in FIG. 6A, block 614 above. The queue group inspection cancelation module 920 checks for a threshold queue group occupancy tracking threshold action cancelation as described in FIG. 6A, block 616 above.

Figure 9B:
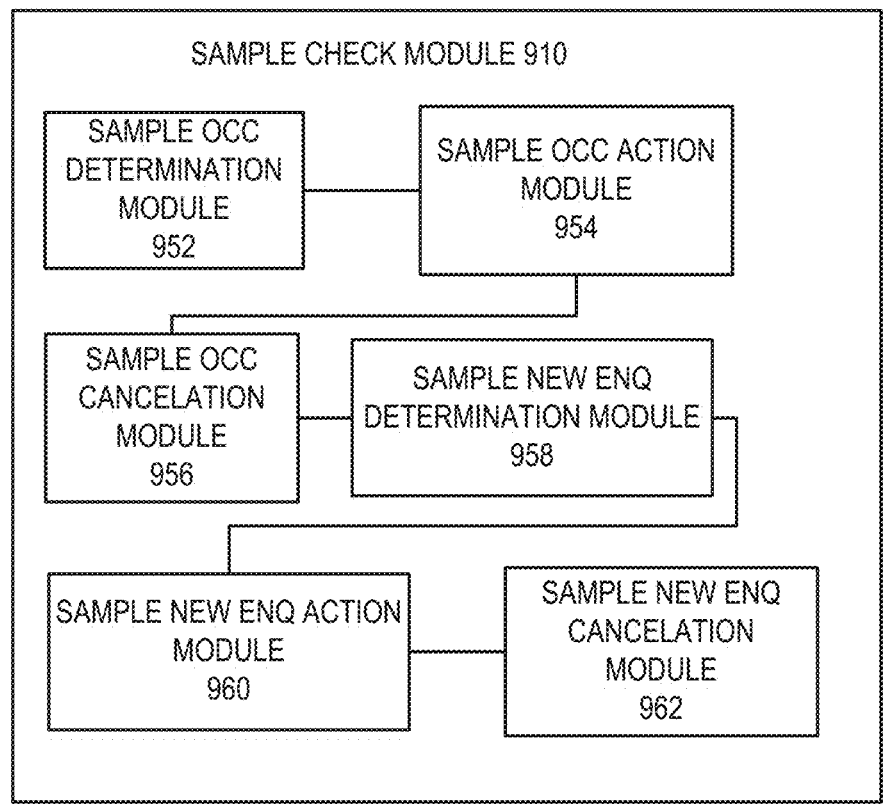
FIG. 9B is a block diagram of a sample check module that checks for a sample threshold action.

FIG. 9B is a block diagram of a sample check module 910 that checks for a sample threshold action. In one embodiment, the sample check module includes a sample occupants determination module 952, sample occupants action module 954, sample occupants cancelation module 956, sample new enqueues determination module 958, sample new enqueues action module 960, and sample new enqueue cancelation module 962. In one embodiment, the sample occupants determination module 952 determines if the queue occupancy is at or above the sample occupants threshold as described in FIG. 6B at block 652 above. The sample occupants action module 954 performs one or more actions as described in FIG. 6B at block 654 above. The sample occupants cancelation module 956 checks for a sample occupants action cancelation as described in FIG. 6B at block 656 above. The sample new enqueues determination module 958 determines if the queue occupancy of at or greater than the sample new enqueues threshold as described in FIG. 6B at block 658 above. The sample new enqueues action module 960 performs one or more actions as described in FIG. 6B at block 660 above. The sample new enqueue cancelation module 962 checks for a sample new enqueues action cancelation as described in FIG. 6B at block 662 above.

Figure 10:
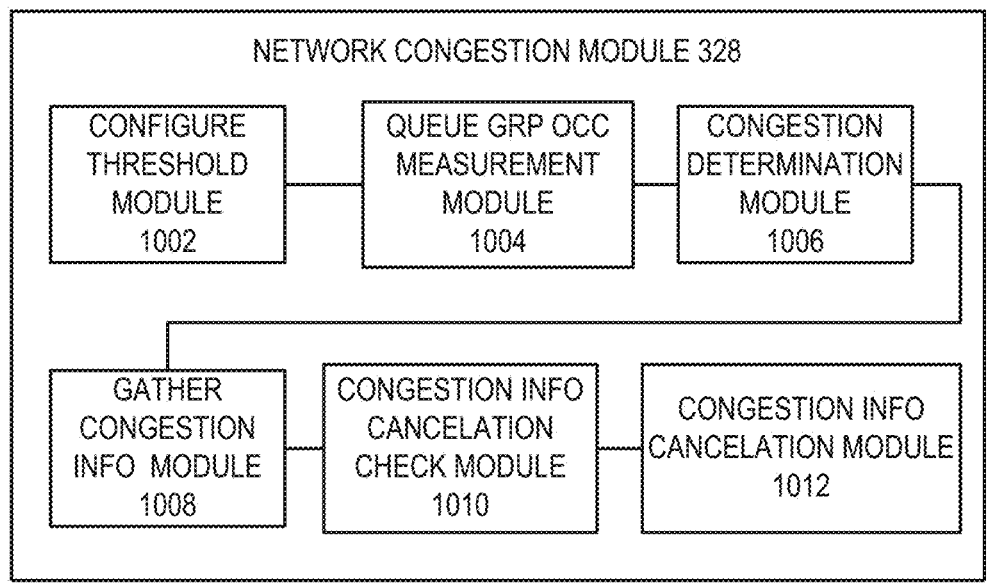
FIG. 10 is a block diagram of a network congestion module that monitors a queue group occupancy of a port queue group and performs an action if the drop capture threshold is reached.

FIG. 10 is a block diagram of a network congestion module 328 that monitors a queue group occupancy of a port queue group and performs an action if the drop capture threshold is reached. In one embodiment, the network congestion module 328 includes a configure threshold module 1002, queue group occupancy measurement module 1004, congestion determination module 1006, gather congestion information module 1008, congestion information cancelation check module 1010, and congestion information cancelation module 1012. In one embodiment, the configure threshold module 1002 configures the threshold as described in FIG. 7, block 702 above. The queue group occupancy measurement module 1004 measures the queue group occupancy as described in FIG. 7, block 704 above. The congestion determination module 1006 determines if there is congestion for a queue group as described in FIG. 7, block 706 above. The gather congestion information module 1006 gathers the congestion effect information (and/or perform other actions) as described in FIG. 7, block 708 above. The congestion information cancelation check module 1010 checks for a drop capture threshold action cancelation as described in FIG. 7, block 7010 above. The congestion information cancelation module 1010 cancels the congestion information gathering as described in FIG. 7, block 712 above.

Figure 11:
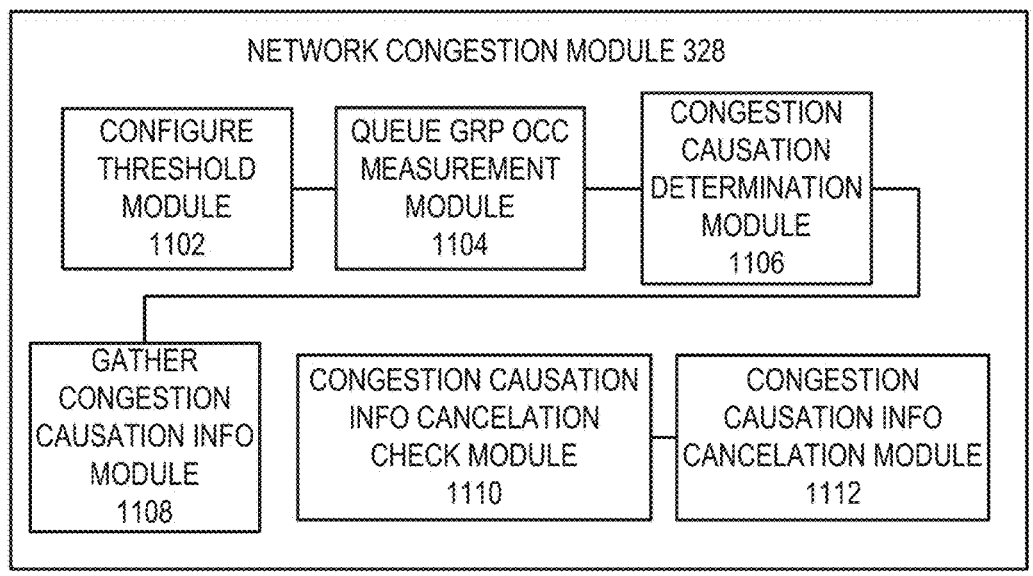
FIG. 11 is a block diagram of a network congestion module that monitors a queue group occupancy of a port queue group and performs an action if one of the congestion causation thresholds is reached.

FIG. 11 is a block diagram of a network congestion module 328 that monitors a queue group occupancy of a port queue group and performs an action if one of the congestion causation thresholds is reached. In one embodiment, the network congestion module 328 includes a configure threshold module 1102, queue group occupancy measurement module 1104, congestion determination module 1106, gather congestion information module 1108, congestion information cancelation check module 1110, and congestion information cancelation module 1112. In one embodiment, the configure threshold module 1102 configures the threshold as described in FIG. 8, block 802 above. The queue group occupancy measurement module 1104 measures the queue group occupancy as described in FIG. 8, block 804 above. The congestion causation determination module 1106 determines if there is a potential for congestion of a queue group as described in FIG. 8, block 806 above. The gather congestion causation information module 1108 gathers the congestion causation information (and/or perform other actions) as described in FIG. 8, block 808 above. The congestion causation information cancelation check module 1110 checks for a congestion causation threshold action cancelation as described in FIG. 8, block 810 above. The congestion causation information cancelation module 1112 cancels the congestion causation information gathering as described in FIG. 8, block 812 above.

Figure 12:
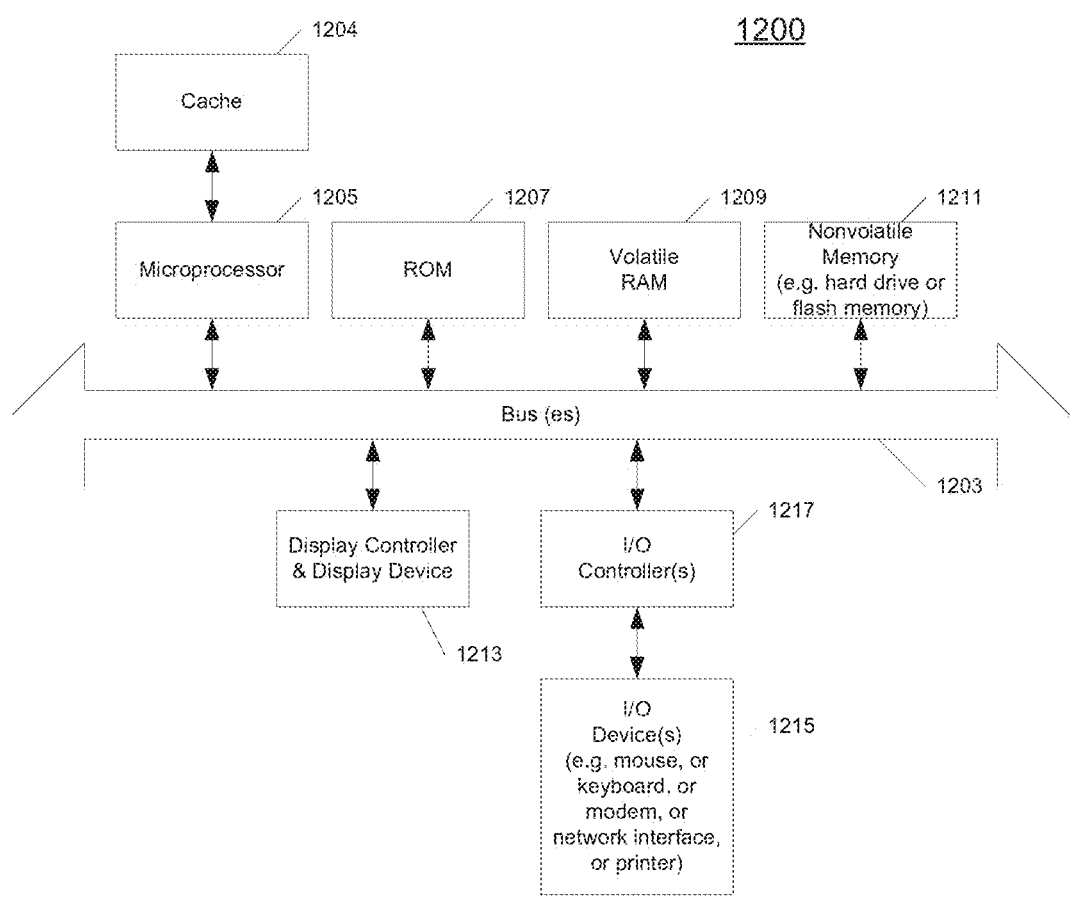
FIG. 12 illustrates one example of a typical computer system, which may be used in conjunction with the embodiments described herein.

FIG. 12 shows one example of a data processing system 1200, which may be used with one embodiment of the present invention. For example, the system 1200 may be implemented including a network element 302 as shown in FIG. 3. Note that while FIG. 12 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 12, the computer system 1200, which is a form of a data processing system, includes a bus 1203 which is coupled to a microprocessor(s) 1205 and a ROM (Read Only Memory) 1207 and volatile RAM 1209 and a non-volatile memory 1211. The microprocessor 1205 may retrieve the instructions from the memories 1207, 1209, 1211 and execute the instructions to perform operations described above. The bus 1203 interconnects these various components together and also interconnects these components 1205, 1207, 1209, and 1211 to a display controller and display device 1215 and to peripheral devices such as input/output (I/O) devices which may be mice, keyboards, modems, network interfaces, printers and other devices which are well known in the art. Typically, the input/output devices 1215 are coupled to the system through input/output controllers 1217. The volatile RAM (Random Access Memory) 1209 is typically implemented as dynamic RAM (DRAM), which requires power continually in order to refresh or maintain the data in the memory.

The mass storage 1211 is typically a magnetic hard drive or a magnetic optical drive or an optical drive or a DVD RAM or a flash memory or other types of memory systems, which maintain data (e.g. large amounts of data) even after power is removed from the system. Typically, the mass storage 1211 will also be a random access memory although this is not required. While FIG. 12 shows that the mass storage 1211 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 1203 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "process virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

Figure 13:
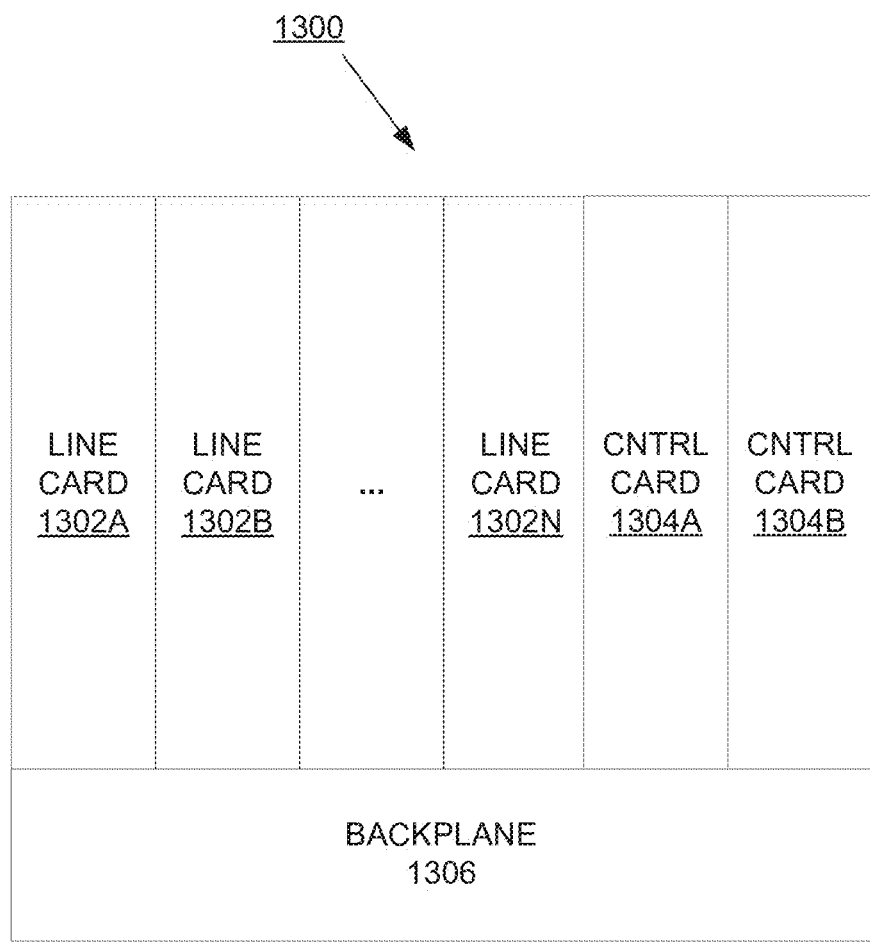
FIG. 13 is a block diagram of one embodiment of an exemplary network element that that determines a cause and effect of congestion in this network element according to one embodiment of the system.

FIG. 13 is a block diagram of one embodiment of an exemplary network element 1300 that determines a cause and effect of congestion in this network element according to one embodiment of the system. In FIG. 13, the backplane 1306 couples to the line cards 1302A-N and controller cards 1304A-B. While in one embodiment, the controller cards 1304A-B control the processing of the traffic by the line cards 1302A-N, in alternate embodiments, the controller cards 1304A-B, perform the same and/or different functions (storing information for determining a cause and effect of congestion, etc.). In one embodiment, the line cards 1302A-N process and forward traffic according to the network policies received from controller cards the 1304A-B. In one embodiment, one of the line cards 1302A-N monitors queue group occupancies of queue groups and collect information to determine a cause and effect of congestion in the queue group as described in FIGS. 3, 4, and 6-8. In this embodiment, one, some, or all of the line cards 1302A-N includes the network congestion module to determine a cause and effect of congestion in this network element 1300, such as the network congestion module 328 as described in FIG. 3 above. In another embodiment, the controller cards 1304A-N determines a cause and effect of congestion for each port that exhibits congestion of the respective line card 1304A-N as described in FIGS. 3 and 6-8. It should be understood that the architecture of the network element 1300 illustrated in FIG. 13 is exemplary, and different combinations of cards may be used in other embodiments of the invention.

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "measuring," "receiving," "determining," "transmitting," "sending," "forwarding," "detecting," "gathering," "dropping," "communicating," "canceling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A non-transitory machine-readable medium having executable instructions to cause one or more processing units to perform a method to determine a cause of congestion in a network element, the method comprising:
   configuring a queue group corresponding to a port of the network element with a sample new enqueue threshold and a sample occupants threshold, wherein the sample new enqueue threshold is a threshold when new enqueue packets are sampled for characteristics of a subset of the new enqueue packets to be enqueued to that queue group, the sample occupants threshold is a threshold when a subset of a plurality of packets stored in the queue group are sampled for characteristics, and the sample new enqueue and the sample occupants thresholds are different;
   measuring a queue group occupancy of the queue group for the port in the network element, wherein the queue group stores the plurality of packets to be communicated through that port;
   gathering information of the subset of the new enqueue packets for that queue group when the queue group occupancy measurement is above the sample new enqueue threshold;
   gathering information of the subset of the plurality of packets for that queue group when the queue group occupancy measurement is above the sample occupants threshold; and
   transmitting at least one of the plurality of packets in the queue group when the queue group occupancy measurement is below a lower of the sample occupants threshold and the sample new enqueue threshold.

2. The non-transitory machine-readable medium of claim 1, wherein the gathered information of the subset of the plurality of packets is used to determine a cause of a potential congestion.

3. The non-transitory machine-readable medium of claim 1, wherein the queue group is selected from the group consisting of a single queue, multiple queues, a class of queues, and multiple classes of queues.

4. The non-transitory machine-readable medium of claim 1, wherein the gathering information of the subset of the new enqueue packets comprises:
   transmitting the new enqueue packets out another port.

5. The non-transitory machine-readable medium of claim 4, wherein the gathering information of the subset of the new enqueue packets comprises:
   sending the subset of the new enqueue packets to a control plane, wherein the subset of the new enqueue packets is stored for later congestion effect analysis.

6. The non-transitory machine-readable medium of claim 1, further comprising:
dropping at least some of the plurality of packets.

7. A non-transitory machine-readable medium having executable instructions to cause one or more processing units to perform a method to determine a cause of congestion in a network element, the method comprising:
configuring a queue group corresponding to a port of the network element with a sample new enqueue threshold and a drop threshold, wherein the sample new enqueue threshold is a threshold when new enqueue packets are sampled for characteristics of a subset of the new enqueue packets to be enqueued to that queue group, the drop threshold is a threshold when packets are dropped, and the sample new enqueue threshold is less than the drop threshold;
measuring a queue group occupancy of the queue group for the port in the network element, wherein the queue group stores a plurality of packets to be communicated through that port;
gathering information of the subset of the new enqueue packets for that queue group when the queue group occupancy measurement is above the sample new enqueue threshold, wherein the gathered information of the subset of the new enqueue of packets is used to determine a cause of a potential congestion; and
transmitting at least one of the plurality of packets in the queue group when the queue group occupancy measurement is below the sample new enqueue threshold.

8. The non-transitory machine-readable medium of claim 7, wherein the queue group is selected from the group consisting of a single queue, multiple queues, a class of queues, and multiple classes of queues.

9. A non-transitory machine-readable medium having executable instructions to cause one or more processing units to perform a method to characterize a queue group in a network element, the method comprising:
configuring the queue group corresponding to a port of the network element with a record occupancy threshold and a drop threshold, wherein the drop threshold is a threshold when packets are dropped and the record occupancy threshold is less than the drop threshold;
measuring a queue group occupancy of the queue group for the port in the network element, wherein the queue group stores a plurality of packets to be communicated through that port;
recording the queue group occupancy if the queue group occupancy is greater than the record occupancy threshold, wherein the queue group occupancy recording is turned off if the queue group occupancy is below the record occupancy threshold and the recording stores a plurality of queue group occupancy values from the queue group occupancy recording; and
transmitting at least one of the plurality of packets in the queue group when the queue group occupancy measurement is below the drop threshold.

10. The non-transitory machine-readable medium of claim 9, wherein the queue group is selected from the group consisting of a single queue, multiple queues, a class of queues, and multiple classes of queues.

11. A method to determine a cause of congestion in a network element, the method comprising:
configuring a queue group corresponding to a port of the network element with a sample new enqueue threshold and a sample occupants threshold, wherein the sample new enqueue threshold is a threshold when new enqueue packets are sampled for characteristics of a subset of the new enqueue packets to be enqueued to that queue group, the sample occupants threshold is a threshold when a subset of a plurality of packets stored in the queue group are sampled for characteristics, and the sample new enqueue and the sample occupants thresholds are different;
measuring a queue group occupancy of the queue group for the port in the network element, wherein the queue group stores the plurality of packets to be communicated through that port;
gathering information of the subset of the new enqueue packets for that queue group when the queue group occupancy measurement is above the sample new enqueue threshold;
gathering information of the subset of the plurality of packets for that queue group when the queue group occupancy measurement is above the sample occupants threshold; and
transmitting at least one of the plurality of packets in the queue group when the queue group occupancy measurement is below a lower of the sample occupants threshold and the sample new enqueue threshold.

12. The method of claim 11, wherein the queue group is selected from the group consisting of a single queue, multiple queues, a class of queues, and multiple classes of queues.

13. The method of claim 11, wherein the gathering information of the subset of the new enqueue packets comprises:
transmitting the new enqueue packets out another port.

14. The method of claim 13, wherein the gathering information of the subset of the new enqueue packets comprises:
sending the subset of the new enqueue packets to a control plane, wherein the subset of the new enqueue packets is stored for later congestion effect analysis.

15. A method to determine a cause of congestion in a network element, the method comprising:
configuring a queue group corresponding to a port of the network element with a sample new enqueue threshold and a drop threshold, wherein the sample new enqueue threshold is a threshold when new enqueue packets are sampled for characteristics of a subset of the new enqueue packets to be enqueued to that queue group, the drop threshold is a threshold when packets are dropped, and the sample new enqueue threshold is less than the drop threshold;
measuring a queue group occupancy of the queue group for the port in the network element, wherein the queue group stores a plurality of packets to be communicated through that port;
gathering information of the subset of the new enqueue packets for that queue group when the queue group occupancy measurement is above the sample new enqueue threshold, wherein the gathered information of the subset of the new enqueue packets is used to determine a cause of potential congestion; and
transmitting at least one of the plurality of packets in the queue group when the queue group occupancy measurement is below the sample new enqueue threshold.

16. The method of claim 15, wherein the queue group is selected from the group consisting of a single queue, multiple queues, a class of queues, and multiple classes of queues.

17. A method to characterize a queue group in a network element, the method comprising:

configuring the queue group corresponding to a port of the network element with a record occupancy threshold and a drop threshold, wherein the drop threshold is a threshold when packets are dropped and the record occupancy threshold is less than the drop threshold;

measuring a queue group occupancy of the queue group for the port in the network element, wherein the queue group stores a plurality of packets to be communicated through that port;

recording the queue group occupancy if the queue group occupancy is greater than the record occupancy threshold, wherein the queue group occupancy recording is turned off if the queue group occupancy is below the record occupancy threshold and the recording stores a plurality of queue group occupancy values from the queue group occupancy recording; and transmitting at least one of the plurality of packets in the queue group when the queue group occupancy measurement is below the drop threshold.

18. A network element to determine a cause of congestion in the network element, the network element comprising:

a port to be coupled to a network, the port to communicate a plurality of packets between the network and the network element; and a data plane to be coupled to the port, the data plane including, a queue group, coupled to the port, the queue group to store the plurality of packets;

storage; and a network congestion module, coupled to the queue group, the network congestion module to configure the queue group corresponding to the port of the network element with a sample new enqueue threshold and a sample occupants threshold, wherein the sample new enqueue threshold is a threshold when new enqueue packets are sampled for characteristics of a subset of the new enqueue packets to be enqueued to that queue group, the sample occupants threshold is a threshold when a subset of the plurality of packets stored in the queue group are sampled for characteristics, and the sample new enqueue and the sample occupants thresholds are different, measure a queue group occupancy of the queue group for the port in the network element, wherein the queue group stores the plurality of packets to be communicated through that port, gather information of the subset of the new enqueue packets for that queue group when the queue group occupancy measurement is above the sample new enqueue threshold, gather information of the subset of the plurality of packets for that queue group when the queue group occupancy measurement is above the sample occupants threshold, and transmit at least one of the plurality of packets in the queue group when the queue group occupancy measurement is below a lower of the sample occupants threshold and the sample new enqueue threshold, wherein the network congestion module stores the information of the subset of the new enqueue packets in the storage.

* * * * *